United States Patent
Kern et al.

(10) Patent No.: US 10,567,007 B2
(45) Date of Patent: Feb. 18, 2020

(54) DEVICE AND METHOD OF PROCESSING A DATA WORD USING CHECKBITS

(71) Applicant: Infineon Technologies AG, Neubiberg (DE)

(72) Inventors: Thomas Kern, Aschheim (DE); Roland Brachmann, Munich (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 242 days.

(21) Appl. No.: 15/449,029

(22) Filed: Mar. 3, 2017

(65) Prior Publication Data

US 2017/0257120 A1    Sep. 7, 2017

(30) Foreign Application Priority Data

Mar. 4, 2016   (DE) .................. 10 2016 104 012

(51) Int. Cl.
   *H03M 13/29*  (2006.01)
   *G06F 11/10*  (2006.01)

(52) U.S. Cl.
   CPC ..... *H03M 13/2906* (2013.01); *G06F 11/1076* (2013.01)

(58) Field of Classification Search
   CPC ............ H03M 13/29; H03M 13/2903; H03M 13/2906; H03M 13/2927; H03M 13/2942; G06F 11/08; G06F 11/10; G06F 11/1004; G06F 11/1008; G06F 11/1016; G06F 11/1044; G06F 11/1068; G06F 11/1076; H04L 1/004; H04L 1/0056; H04L 1/0072
   See application file for complete search history.

(56) References Cited

U.S. PATENT DOCUMENTS

| | | | | |
|---|---|---|---|---|
| 2004/0019822 | A1* | 1/2004 | Knapp, III | G06F 8/60 714/6.22 |
| 2012/0278681 | A1* | 11/2012 | Moyer | G06F 11/1016 714/763 |
| 2013/0024605 | A1* | 1/2013 | Sharon | G06F 11/1072 711/103 |
| 2013/0132804 | A1* | 5/2013 | Frayer | G06F 11/1012 714/780 |

(Continued)

OTHER PUBLICATIONS

"Kreuzsicherung." Wikipedia. https://de.wikipedia.org/w/indix.php?title=Kreuzsicherung&oldid=147801212. Nov. 10, 2016. 4 pages.

(Continued)

*Primary Examiner* — Kyle Vallecillo
(74) *Attorney, Agent, or Firm* — Eschweiler & Potashnik, LLC

(57) ABSTRACT

A method is proposed for processing a data word, in which the data word comprises a first partial data word and a second partial data word, in which first checkbits are defined for the first partial data word, wherein the first partial data word and the first checkbits form a first codeword, in which second checkbits are defined for the second partial data word, wherein the second partial data word and the second checkbits form a second codeword, in which third checkbits are defined for the data word, wherein at least (i) the data word, (ii) a linking of the first checkbits with the second checkbits, and (iii) the third checkbits are parts of a third codeword.

33 Claims, 8 Drawing Sheets

(56) References Cited

U.S. PATENT DOCUMENTS

| | | | |
|---|---|---|---|
| 2013/0145229 A1* | 6/2013 | Frayer | H03M 13/2903 |
| | | | 714/755 |
| 2013/0145231 A1* | 6/2013 | Frayer | H03M 13/13 |
| | | | 714/763 |
| 2014/0223256 A1* | 8/2014 | Sakai | G06F 11/1012 |
| | | | 714/758 |

OTHER PUBLICATIONS

"Hamming-Code" Wikipedia. https://wikipedia.org/w/index.php?title=Hamming-Code&oldid=151674725. Nov. 10, 2016. 12 pages.

* cited by examiner

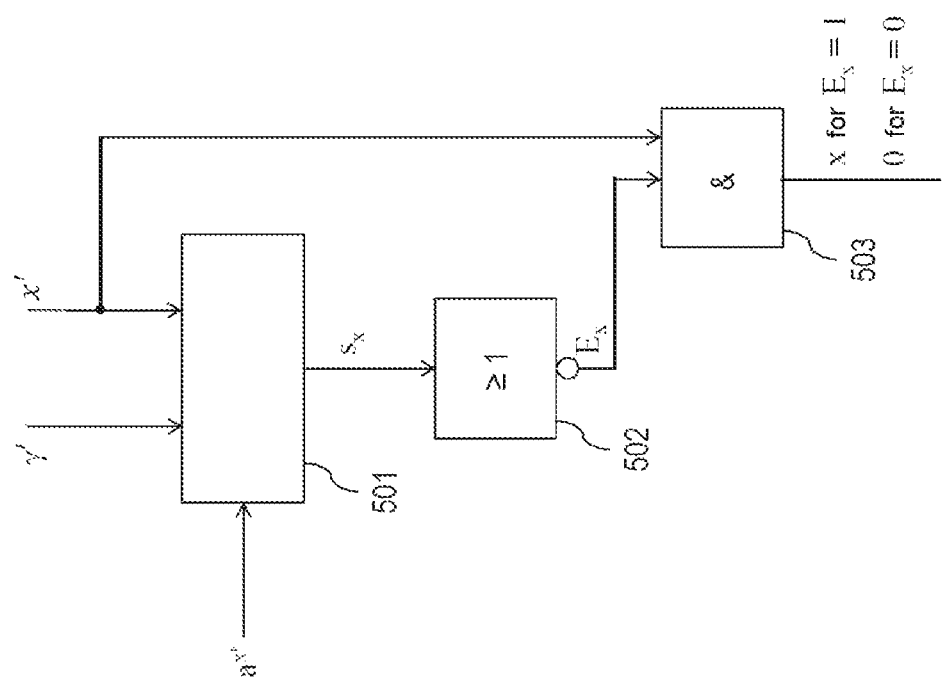

| Power representation $z^i$ | Polynomial $z^i$ modulo $G_1(z)$ | Vectorial representation |
|---|---|---|
| $z^0$ | $1$ | 0001 |
| $z^1$ | $z$ | 0010 |
| $z^2$ | $z^2$ | 0100 |
| $z^3$ | $z^3$ | 1000 |
| $z^4$ | $z+1$ | 0011 |
| $z^5$ | $z^2+z$ | 0110 |
| $z^6$ | $z^3+z^2$ | 1100 |
| $z^7$ | $z^4+z^3=z^3+z+1$ | 1011 |
| $z^8$ | $z^4+z^2+z=z^2+1$ | 0101 |
| $z^9$ | $z^3+z$ | 1010 |
| $z^{10}$ | $z^4+z^2=z^2+z+1$ | 0111 |
| $z^{11}$ | $z^3+z^2+z$ | 1110 |
| $z^{12}$ | $z^4+z^3+z^2=z^3+z^2+z+1$ | 1111 |
| $z^{13}$ | $z^4+z^3+z^2+z=z^3+z^2+1$ | 1101 |
| $z^{14}$ | $z^4+z^3+z+1=z^3+1$ | 1001 |
| $z^{15}=z^0$ | $1$ | 0001 |

Fig.7

DEVICE AND METHOD OF PROCESSING A DATA WORD USING CHECKBITS

CROSS REFERENCE TO RELATED APPLICATIONS

This application claims priority to German Patent Application number 10 2016 104 012.6 filed on Mar. 4, 2016, which is hereby incorporated in its entirety.

FIELD

It is known that permanent or transient faults can occur in electronic circuits and in memories. Faults of this type can result in bit errors in binary words. Here, a binary word comprises a plurality of bits, e.g. 8 bits, 16 bits, or generally a multiplicity of bits.

SUMMARY

The object of the invention is to provide a facility for an efficient error detection and/or error correction.

This object is achieved according to the features of the independent claims. Preferred embodiments can be found, in particular, in the dependent claims.

To achieve the object, a method is proposed for processing a data word, in which the data word comprises a first partial data word and a second partial data word, in which first checkbits are defined for the first partial data word, wherein the first partial data word and the first checkbits form a first codeword, in which second checkbits are defined for the second partial data word, wherein the second partial data word and the second checkbits form a second codeword, in which third checkbits are defined for the data word, wherein at least the data word, a linking of the first checkbits with the second checkbits, and the third checkbits are parts of a third codeword.

It should be noted here that the individual codewords are defined on the basis of checkbits, partial data words or the data word and possibly further data bits. In this respect, the list proposed here is not to be understood as exhaustive, but rather the definition of the respective codeword comprises (not exhaustively) the bits specified here.

It should furthermore be noted that the respective checkbits may have any given check values. In particular, the information of a checkbit or a check value may be stored in at least one memory cell.

It should also be noted that the data word may be a data word stored in a memory or to be stored in a memory. This data word is processed, for example, in such a way that first, second and third checkbits are generated according to the above rule and are stored at least partially in this memory or in a further memory. In particular, the method may therefore be a method for creating checkbits associated with the data word and for storing such checkbits.

In one development, at least two bits of the first checkbits and at least two bits of the second checkbits are linked.

In one development, the first checkbits, the second checkbits and the third checkbits are stored in at least one memory.

In one development, the linking of the first checkbits with the second checkbits comprises one of the following options:

an exclusive OR linking, an exclusive NOT-OR linking, a combination or juxtaposition of the first checkbits and the second checkbits.

In one development, the first partial data word and the second partial data word are stored.

In one development, the first codeword is a codeword of a first error code and the second codeword is a codeword of a second error code.

In one development, the first error code and the second error code are in each case an error-detecting or an error-correcting code.

The first error code may optionally be equal to the second error code. In a further option, the first error code and the second error code have a distance between codes of at least 3.

In one development, the third codeword is a codeword of a third error code.

In one development, the third error code is an error-correcting code.

In one development, the third error code has a distance between codes greater than or equal to three or greater than or equal to five.

The first error code or the second error code may, for example, be a linear code with a predefined number of checkbits, for example 7 checkbits, a Hamming code, a Hsiao code or BCH code. The number of checkbits defines an error detection probability. The third error code may, for example, be a t-bit error-correcting code or a t-bit error-correcting code and t+1 bit error-detecting code, for example a BCH code, wherein $t \geq 1$ applies.

The first error code and the second error code may optionally be used (only) for error detection or partially for error correction and partially for error detection. For example, a Hsiao code can be used for correcting 1-bit errors and for detecting 2-bit errors. The 2-bit error can then be corrected with the third error code, e.g. a 2-bit error-correcting BCH code.

In one development, the number of first checkbits is greater than or equal to two or the number of second checkbits is greater than or equal to two.

In one development, the first checkbits, the second checkbits and/or the third checkbits comprise address bits or bits derived from address bits.

Address bits or bits derived from address bits may be stored and used as checkbits, particularly for the correctness of the created address. Thus, for example, during writing, the parity of the write address can be defined and stored under the write address. During reading, the parity of the read address can be formed and compared with stored parity of the write address. A difference then shows an error in the addressing.

The facility exists for the address bits to be provided by an address generator during the reading or writing, and to be used as information bits along with the data bits in order to define the checkbits from data bits and address bits.

For example, during writing, the address bits are provided by the address generator as a write address, the checkbits are calculated from the data bits and the address bits and are stored together with the data bits. The address bits do not have to be stored here.

In one option, in particular, bits can be read from memory cells which store more than one bit or store fewer than one bit.

In a further option, data words or parts of data words can also be written to the memory in inverted form.

In one development, the first partial data word, the first checkbits and address bits or bits derived from address bits form the first codeword.

In one development,
the data word,
the linking of the first checkbits with the second checkbits,
the third checkbits, and
address bits or bits derived from address bits form the third codeword.

In one option, the address bits or the bits derived from address bits are stored in a memory.

In one development, the first checkbits, the second checkbits and/or the third checkbits are stored at different addresses of a memory.

It is possible, for example, for the first partial data word to be stored under an address a and for the second partial data word to be stored under an address $\bar{a}$, wherein the inverted address $\bar{a}$ can be defined from the address a by inverting all address bits of the address a.

In one development the first partial data word and the second partial data word are stored at different addresses of the memory.

In one development, the different addresses differ in their lowest-value bit or in all bits.

The lowest-value bit is also referred to as the "least significant bit" (LSB).

In one development, the partial data words are stored under an address in different bits positions in the memory.

In one development, the memory comprises a memory of the following type:
a cache memory,
a register or a register array,
a flash memory,
an MRAM,
an SRAM,
an RE-RAM,
a PC RAM,
an FE-RAM.

A method for processing a data word is also proposed for achieving the above object, wherein the data word comprises a first partial data word and a second partial data word, comprising the following steps:
defining a first bit sequence at least on the basis of first checkbits and the first partial data word,
checking whether the first bit sequence is a codeword,
if the first bit sequence is not a codeword: performing an error correction of the data word at least on the basis of the first checkbits and further checkbits, wherein the further checkbits are defined using the first checkbits.

For example, a check for errors can be carried out for the data word stored in a memory by using the checkbits stored in this memory or in at least one other memory for the error detection. An error correction can be carried out if an error has been detected. In one particular option, the data word is corrected by the error correction and is further processed following the correction. For example, the data word can be checked during a read, write or delete access to the memory.

One advantage of this solution is that an error in a part of the data word can be detected and only then is an error correction carried out. The correction requires access to further bits, i.e. the (at least one) further part of the data word and the further checkbits. Access of this type advantageously does not occur if no error has been identified for the first partial data word.

It would also be possible in principle to check whether the second bit sequence is a further codeword and, if the second bit sequence is not a further codeword, to perform the error correction of the data word. However, since the first bit sequence has not formed a codeword, an error has been detected in the data word (more precisely: the first partial data word of the data word). This error is then corrected by means of the further checkbits.

The method is thus suitable for error detection and error correction in the data word. For example, the first checkbits are defined for the first partial data word, wherein, in the error-free case, the bits of the first partial data word and the first checkbits form a first codeword of a first error code. For example, second checkbits are defined for the second partial data word, wherein, in the error-free case, the bits of the second partial data word and the second checkbits form a second codeword of a second error code. Furthermore, for example, a check can be carried out for the entire data word to determine whether the bits of the data word, in combination with entire checkbits which are based on the first checkbits, the second checkbits and third checkbits, form a third codeword of a third error code in the error-free case.

For example, at least two bits and fewer than all bits of the entire checkbit are defined as a bit-by-bit (unambiguously reversible) linking of corresponding checkbits of at least two partial data words.

If, for example, a first and a second partial data word of the data word are present, and if the first error code and the second error code in each case have, for example, I first checkbits and I second checkbits with I≥2, and if the third error code has L checkbits with L>1, then, for example, I third checkbits of the L checkbits can be defined as a component-by-component XOR linking of the I first checkbits and the I second checkbits. Only L−1 checkbits of the L checkbits of the third error code can be stored, since the remaining I checkbits of the L checkbits are already defined from the I first checkbits and the I second checkbits.

It is also possible for more than two partial data words to be used. In this case, at least two and fewer than all checkbits of the data word can be defined as a component-by-component linking of checkbits of more than two partial data words.

By means of the approach explained above, if, using the first error code, an error is detected and not corrected in bits of the data word which are bits of the first partial data word, or if, using the second error code, an error is detected and not corrected in bits of the data word which are bits of the second partial data word, it is possible for an error in the data word to be corrected using the third error code (insofar as the error that has occurred is correctable by means of the third error code).

It is possible, for example, that the first error code is a τ-bit error-correcting and t-bit error-detecting code, wherein 0<τ<t≥2 applies. The third error code is a T-bit error-correcting error code with T≥t, wherein, if a t-bit error has been detected in bits of the data word which are bits of the first partial data word using the first error code and is not correctable using the first error code, the t-bit error in the data word is corrected using the third error code.

It is also possible that the second error code is a τ-bit error-correcting and t-bit error detecting code, wherein 0<τ<t≥2 applies. The third error code is a T-bit error-correcting error code with T>t, wherein, if a t-bit error has been detected in bits of the data word which are bits of the second partial data word using the second error code and is not correctable using the second error code, the t-bit error in the data word is corrected using the third error code. Checkbits of the third error code can be defined, for example, as an XOR linking of corresponding checkbits of the first and the second error code.

In one development, the further checkbits are defined using at least two first checkbits.

In one development, the first checkbits are associated with the first partial data word.

In one development,
the further checkbits comprise second checkbits and third checkbits
wherein the second checkbits are associated with the second partial data word, and
wherein the third checkbits are associated with the data word.

In one development, the error correction of the data word is performed on the basis of a linking of the first checkbits, the second checkbits and the third checkbits.

In one development, the number of first checkbits is greater than or equal to two or the number of second checkbits is greater than or equal to two.

In one development, the method comprises the following step: if the first bit sequence is a codeword: carrying out a predefined first action.

The predefined first action may be an action which is performed if no error (in the first partial data word) has been detected. It can be assumed accordingly with high probability that no read error is present. For example, a check of a memory or a read procedure can be continued.

In one development, the method comprises the following step: if the first bit sequence is not a codeword: performing a correction of the first partial data word on the basis of the first checkbits.

In one development, the first checkbits, the first partial data word, the second partial data word and the further checkbits are read from a memory.

In one development, the codeword is a codeword of an error-correcting code.

In one development, the method comprises the following step: if the first bit sequence is not a codeword: performing the error correction of the data word on the basis of the first checkbits and the further checkbits, and also on the basis of address bits or bits derived from address bits.

During reading, the address bits are provided, for example, by the address generator as a read address, and the checkbits are calculated from possibly errored data bits and from the address bits of the read address and are compared with the possibly errored checkbits that have been read.

It is furthermore also possible to store address bits of the write address or bits derived from the address bits of the write address in the memory and, during reading, to compare the address bits of the write address read under a read address with the created bits of the read address.

In one development, the method comprises the following step: defining the first bit sequence on the basis of the first checkbits, the first partial data word and address bits or bits derived from address bits.

In one option, the address bits or bits derived from address bits are read from the memory or are provided by an address generator.

A circuit arrangement is also proposed for processing a data word, wherein the data word comprises a first partial data word and a second partial data word, wherein the circuit arrangement is configured:
to define first checkbits for the first partial data word, wherein the first partial data word and the first checkbits form a first codeword,
to define second checkbits for the second partial data word, wherein the second partial data word and the second checkbits form a second codeword,
to define third checkbits for the data word, wherein at least
the data word,
a linking of the first checkbits with the second checkbits, and
the third checkbits
are parts of a third codeword.

Furthermore, a device is proposed for processing a data word, wherein the data word comprises a first partial data word and a second partial data word, wherein the device comprises a processing unit which is configured to carry out the following step:
defining a first bit sequence at least on the basis of first checkbits and the first partial data word,
checking whether the first bit sequence is a codeword,
if the first bit sequence is not a codeword: performing an error correction of the data word at least on the basis of the first checkbits and further checkbits, wherein the further checkbits are defined using the first checkbits.

It should be noted here that the circuit arrangement may be designed, for example, as a processor unit and/or an at least partially hard-wired or logical circuit arrangement which is configured, for example, in such a way that the method can be carried out as described herein.

The circuit arrangement may be designed as a processing unit and may be or may comprise, in particular, any type of processor or calculator or computer with correspondingly necessary peripherals (memory, input/output interfaces, input/output device, etc.).

The explanations given above relating to the method apply accordingly to the device, here, by way of example, the aforementioned circuit arrangement. The device may be designed in one component or may be distributed in a plurality of components.

The aforementioned object is also achieved by means of a system comprising at least one of the devices described here.

In order to achieve the object, a computer program product is furthermore indicated which is directly loadable into a memory of a digital computer, comprising program code parts which are suitable for carrying out steps of the method described here.

In order to achieve the object, a computer-readable storage medium is also indicated, comprising computer-executable instructions which are configured in such a way that the computer carries out steps of the method described here.

The characteristics, features and advantages of this invention outlined above and the manner in which they are achieved are described below in conjunction with a schematic description of example embodiments which are explained in detail in conjunction with the drawings. For the sake of clarity, identical or identically acting elements are denoted with the same reference numbers.

BRIEF DESCRIPTION OF THE DRAWINGS

In the drawings:
FIG. 5A shows a circuit arrangement for error detection in a first partial data word using a first error-detecting code,
FIG. 7 shows a table which illustrates different representational forms of elements of a Galois field $GF(2^m)$ with $m=4$.

DETAILED DESCRIPTION

Figure 1:
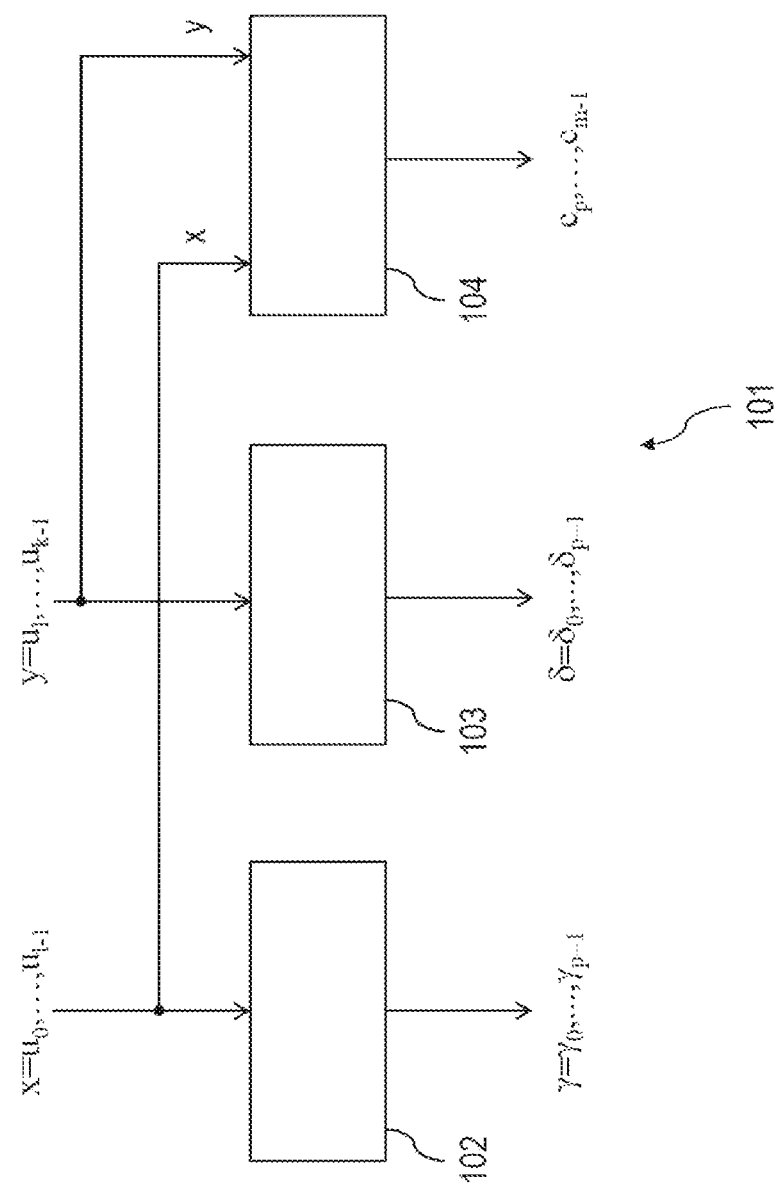
FIG. 1 shows an example of a circuit arrangement for forming checkbits.

An error correction and/or an error detection is/are performed in the examples explained here using codes. A code of this type, also referred to as an error code, can be used for error detection and/or for error correction.

By way of example, binary codes can be considered in which, for data bits (which may form a data word or a partial data word), check values or checkbits are defined which, if necessary in combination with one another, in the error-free case form a codeword of the error code considered. The components of a data word and the individual check values are designed, for example, in binary form as bits. In an additional option, the components of the data word and/or the check values are not binary, but may, for example, assume multiple values. Generally speaking, multiple-value data words and/or multiple-value check values can therefore also be used.

In the embodiments explained here, the components of the data words considered and the individual check values are assumed by way of example to be binary (bits). Without restriction to binary values of this type, the solution described herein is also applicable to data words and check values with multiple-value components, e.g. bytes of a predefined length. It should be noted here that, by way of example, a byte has 8 bits, but may also have a different number of bits.

By way of example, a 2-bit error-correcting BCH code with incorporated global parity is used as an error-correcting code. Hamming codes are used as examples of error-detecting codes.

BCH codes can be used for the error correction of randomly distributed multiple-bit errors. This is described, for example, in [Lin, S., Costello, D.: "Error Control Coding", Prentice Hall, 1983, cf. e.g. pages 141 to 170].

A BCH code with incorporated global parity is a cyclic code and can be described, as with any cyclic code, by its generator polynomial $G(z)$. For a BCH code which is intended to correct 1-bit and 2-bit errors and detect 3-bit errors, the generator polynomial $G(z)$ has the form a. $G(z)=G_1(z) \cdot G_3(z) \cdot P(z)$. (1)

Wherein the following applies:

$G_1(z)$ is the $k_1$-th degree modular polynomial of the considered Galois field $GF(2^{k_1})$ with the root $\alpha=z$. $G_1(z)$ is selected here by way of example as a primitive polynomial.

$G_3(z)$ is the minimal polynomial of the root $\alpha^3=z^3$, which is a $k_2$ degree polynomial with $k_2 \leq k_1$.

$P(z)=(z+1)$ is the polynomial for taking the global parity into account.

Generally, for example, a t-bit error-correcting BCH code with a generator polynomial $G(z)=G_1(z) \cdot G_3(z) \cdot \ldots \cdot G_{2t-1} \cdot P(z)$ 1.

and t>2 can be used. It is also possible to use a 3-bit error-correcting Reed-Muller code or other error-correcting code.

An example of a 2-bit error-correcting BCH code is provided with $k_1=4$ and $G_1(z)=z^4 \oplus z \oplus 1$ (modular polynomial of the Galois field $GF(2^4)$), $G_3(z)=z^4 \oplus z^3 \oplus z^2 \oplus z \oplus 1$ (minimal polynomial of the root $\alpha^3=z^3$)

with $k_2=k_1=4$:

i. $G(z)=G_1(z) \cdot G_2(z) \cdot P(z) = z^9 \oplus z^6 \oplus z^5 \oplus z^4 \oplus z \oplus 1$. (2)

The length of the unshortened code, i.e. the length of the codewords of the unshortened code, is $n=2^4-1=15$, and the number of checkbits of the code is $m=k_1+k_2+1=4+4+1=9$ and the number of information bits is $k=n-m=15-9=6$.

The polynomials $G_1$ and $G_2$ can be defined for $k_1=4$, for example, using the table in [Peterson W. and Weldon E.: "Error-Correcting Codes", MIT Press, 1972, p. 476, Appendix C] in the form $[2,3]_{octal}=010011 \sim z^4+z+1=G_1(z)$ and $[3,7]_{octal}=011111 \sim z^4+z^3+z^2+z+1=G_2(z)$ The distance between codes is $d_{min}=6$, and the code—with the additional global parity—allows a correction of all 1-bit errors and 2-bit errors, and also a detection of all 3-bit errors.

The Galois field $GF(2^4)$ is a finite body with $2^4=16$ elements. The modular polynomial of the Galois field $GF(2^4)$ with 16 elements is the primitive polynomial $G_1(z)=z^4+z+1$.

Elements of a Galois field can be represented in different ways. Different representations for the Galois field $GF(2^4)$ are indicated here by way of example: The 16 elements of the Galois field $GF(2^4)=GF(16)$ can be represented as a value 0 and as the powers of a variable z, i.e. by $0, z^0, z^1, z^2, \ldots, z^{14}$ or $0, \alpha^0, \alpha^1, \alpha^2, \ldots, \alpha^{14}$ wherein α is a primitive element of the Galois field, as $2^4=16$ $3^{rd}$-degree polynomials in z with binary coefficients or as $2^4=16$ four-digit binary vectors (0, 0, 0, 0), (0, 0, 0, 1), . . . , (1, 1, 1, 1), wherein the components of the binary vectors correspond to the coefficients of the respective polynomials.

The use of different representations is useful for technical applications, depending on which operations are to be performed between the elements.

The allocated polynomial representation is defined from $z^i$ by $z^i$ modulo $G_1(z)$, i.e. by a remainder of the division $$z^i : (z^4+z+1).$$

The binary coefficients of the polynomial form the 4-digit binary vector of the vectorial representation. The table shown in FIG. 7 illustrates this relationship.

The power representation is suitable, for example, for describing or implementing the multiplication. The following applies:

$$z^i \cdot z^j = z^{(i+j) \bmod 15}.$$

With the designation $$l = \log(z^i)$$

the following applies:

$$\log [z^i \cdot z^j] = \log(z^i) + \log(z^j)] \bmod (2^{k_1}-1)$$

and the multiplication of two elements in the exponential representation can be reduced to the $2^{k_1}-1=$modulo 15 addition of the exponents which can be implemented, for example, with an "end-around carry".

The polynomial or vectorial representation can be used in order to achieve an efficient implementation of the addition, in which the coefficients of the polynomials or the components of the vectors are modulo-two added. This can be implemented, for example, by means of exclusive-OR gates. The following applies, for example:

$$z^6+z^8=(z^3+z^2)+(z^2+1)=z^3+1=z^{14}$$

or $$1100+0101=1\oplus0,1\oplus1,0\oplus0,0\oplus1=1001.$$

The addition which is defined by a component-by-component modulo-2 addition can be implemented by means of an XOR gate (exclusive-OR gate).

The transition from the exponential representation into the polynomial or vectorial representation can be implemented in the same way as the transition from the polynomial representation or vectorial representation into the exponential representation by means of a memory, e.g. a read-only memory (ROM).

A BCH code can be described by its generator polynomial G(z), a generator matrix G and an H-matrix H. The generator matrix is also referred to as a G-matrix. The G-matrix can be used in systematic or in non-systematic form.

The G-matrix of the BCH code can be defined in its systematic form from the generator polynomial G(z). If the G-matrix is used in its systematic form, the information bits of a codeword can be stored unchanged in the memory and can be read unchanged in the error-free case.

The H-matrix of the code can similarly be used in systematic form or in non-systematic form. If the G-matrix is used in systematic form, it is possible to use the H-matrix in systematic form or in non-systematic form.

In one example, the G-matrix is used in its systematic form and the H-matrix is used in both its systematic form and its non-systematic form. The H-matrix in non-systematic form is also referred to as a separated H-matrix.

For a cyclic code, the coefficients of a code polynomial, i.e. of a polynomial which is divisible by the generator polynomial of the code with no remainder, form a code vector.

Since a BCH code is a special cyclic code, the procedure described is applicable for defining the G-matrix for each BCH code.

In order to derive the G-matrix in systematic form from the generator polynomial G(z) of a given cyclic code, $z^{n-k+i}$ is initially represented for $$i=0,1,\ldots,k-1=0,1,\ldots,5$$

as $$a. \ z^{n-k+i} = a_i(z) \cdot G(z) + b_i(z). \quad (3)$$

This is described, for example, in [Lin, S., Costello, D.: "Error Control Coding", Prentice Hall, 1983, cf. e.g. page 94]. Here, $b_i(z)$ is the remainder of the division of $z^{n-k+i}$ by G(z).

G(z) is a k=9-degree polynomial, so that $b_i(z)$ is at most a k−1=8-degree polynomial.

The following can be derived from equation (3):

$$a. \ z^{n-k+i} + b_i(z) = a_i(z) \cdot G(z). \quad (4)$$

Since $z^{n-k+i}+b_i(z)$ is divisible by G(z) with no remainder according to equation (3), then $$z^{n-k+i}+b_i(z)$$

is a code polynomial. The codeword allocated to this code polynomial $z^{n-k+i}+b_i(z)$ has the following characteristics:

The partial data word of the codeword corresponding to the remainder of the division $b_i(z)$ has only components≠0 in the first k−1=8 columns of the G-matrix.

The partial data word of the codeword allocated to the power $z^{n-k+i}$ has only one component with the value 1, i.e. the (n−k+i)-th component. All other components have the value 0.

i. For i=0, . . . , k−1, these components form the k-dimensional unit matrix $I_k$ as the right part of the G-matrix.

For i=0, . . . , k−1, the coefficients of the polynomials $z^{n-k+i}+b_i(z)$ are codewords which form the rows of the G-matrix of the BCH code in systematic form, so that the systematic form of the G-matrix of the code is defined from the generator polynomial of the BCH code. This is described, for example, in [Lin, S., Costello, D.: "Error Control Coding", Prentice Hall, 1983, cf. e.g. page 94].

For the example of the considered specific code, the rows of the G-matrix can be defined in systematic form as shown below, where the following applies:

$$z^9 : G(z) = z^9 : z^9+z^6+z^4+z+1 = 1 \text{ remainder } z^6+z^5+z^4+z+1,$$

and $$z^9 + \{z^6+z^5+z^4+z+1\}$$

is the first code polynomial. The following applies accordingly:

$z^{10}:G(z)\times z^9:z^9+z^6+z^5+z^4+z+1=z$ remainder $z^7+z^6+z^5+z^2+z$, and $z^{10}+\{z^7+z^6+z^5+z^2+z\}$ is the second code polynomial. Accordingly, in total k=6 divisible by G(z) with no remainder code polynomials $\{1+z+z^4+z^5+z^6\}+z^9$ $\{z+z^2+7^5+z^6+z^7\}+z^{10}$ $\{z^2+z^3+z^6+z^7+z^8\}+z^{11}$ $\{1+z+z^3+z^5+z^6+z^7+z^8\}+z^{12}$ $\{1+z^2+z^5+z^7+z^8\}+z^{13}$ $\{1+z^3+z^4+z^5+z^8\}+z^{14}$ can be defined, the coefficients of which are the (linearly independent) code vectors $g_0 = 110011100\ 100000$ $g_1 = 011001110\ 010000$ $g_2 = 001100111\ 001000$ $g_3 = 110101111\ 000100$ $g_4 = 101001011\ 000010$ $g_5 = \underline{100111001}\ \underline{000001}$ a. Checkbits Data bits which form the cells of the G-matrix. The coefficient of the lowest-value power $z^0$ appears here on the left.

The G-matrix in systematic form is $$G = \begin{pmatrix} 1 & 1 & 0 & 0 & 1 & 1 & 1 & 0 & 0 & 1 & 0 & 0 & 0 & 0 & 0 \\ 0 & 1 & 1 & 0 & 0 & 1 & 1 & 1 & 0 & 0 & 1 & 0 & 0 & 0 & 0 \\ 0 & 0 & 1 & 1 & 0 & 0 & 1 & 1 & 1 & 0 & 0 & 1 & 0 & 0 & 0 \\ 1 & 1 & 0 & 1 & 0 & 1 & 1 & 1 & 1 & 0 & 0 & 0 & 1 & 0 & 0 \\ 1 & 0 & 1 & 0 & 0 & 1 & 0 & 1 & 1 & 0 & 0 & 0 & 0 & 1 & 0 \\ 1 & 0 & 0 & 1 & 1 & 1 & 0 & 0 & 1 & 0 & 0 & 0 & 0 & 0 & 1 \end{pmatrix} = (P_{6,9}, I_6) \quad (5)$$

and a code vector $v = v_0, \ldots, v_{14}$ is defined by $(u_0, u_1, u_2, u_3, u_4, u_5) \cdot G = v_0, v_1,$  (6)

$\ldots v_{14} = c_0, \ldots, c_8, u_0, u_1, \ldots, u_5.$

Here, $u_0, \ldots, u_5$ are the 6 information bits and $c_0, \ldots, c_8$ are the 9 checkbits of the code.

The (9,15)-H-$(I_9, P_{9,6}^T)$, matrix H=allocated to the G-matrix in systematic form is $$H = \begin{pmatrix} 1 & 0 & 0 & 0 & 0 & 0 & 0 & 0 & 0 & 1 & 0 & 0 & 1 & 1 & 1 \\ 0 & 1 & 0 & 0 & 0 & 0 & 0 & 0 & 0 & 1 & 1 & 0 & 1 & 0 & 0 \\ 0 & 0 & 1 & 0 & 0 & 0 & 0 & 0 & 0 & 0 & 1 & 1 & 0 & 1 & 0 \\ 0 & 0 & 0 & 1 & 0 & 0 & 0 & 0 & 0 & 0 & 0 & 1 & 1 & 0 & 1 \\ 0 & 0 & 0 & 0 & 1 & 0 & 0 & 0 & 0 & 1 & 0 & 0 & 0 & 0 & 1 \\ 0 & 0 & 0 & 0 & 0 & 1 & 0 & 0 & 0 & 1 & 1 & 0 & 1 & 1 & 1 \\ 0 & 0 & 0 & 0 & 0 & 0 & 1 & 0 & 0 & 1 & 1 & 1 & 1 & 0 & 0 \\ 0 & 0 & 0 & 0 & 0 & 0 & 0 & 1 & 0 & 0 & 1 & 1 & 1 & 1 & 0 \\ 0 & 0 & 0 & 0 & 0 & 0 & 0 & 0 & 1 & 0 & 0 & 1 & 1 & 1 & 1 \end{pmatrix}. \quad (7)$$

If the H-matrix, which appears here in its systematic form, is multiplied by a valid code vector v, this produces the syndrome 0.

An H-matrix of a BCH code can also be represented in the separated form as $$H = \begin{pmatrix} H_1 \\ H_3 \\ P \end{pmatrix}$$

The following applies here:

$H_1 = (\alpha^0, \alpha^1, \ldots, \alpha^{n-1})$, $H_3 = ((\alpha^0)^3, (\alpha^1)^3, \ldots, (\alpha^{n-1})^3)$, $P = \underbrace{(1, 1, \ldots, 1)}_{n}$.

Furthermore, $n = 2^{k_i} - 1$ applies, and the exponents of $\alpha$ are considered as modulo-n. For the considered code, this produces the H-matrix in separated form as $$H = \begin{pmatrix} 1 & 0 & 0 & 0 & 1 & 0 & 0 & 1 & 1 & 0 & 1 & 0 & 1 & 1 & 1 \\ 0 & 1 & 0 & 0 & 1 & 1 & 0 & 1 & 0 & 1 & 1 & 1 & 1 & 0 & 0 \\ 0 & 0 & 1 & 0 & 0 & 1 & 1 & 0 & 1 & 0 & 1 & 1 & 1 & 1 & 0 \\ 0 & 0 & 0 & 1 & 0 & 0 & 1 & 1 & 0 & 1 & 0 & 1 & 1 & 1 & 1 \\ 1 & 0 & 0 & 0 & 1 & 1 & 0 & 0 & 0 & 1 & 1 & 0 & 0 & 0 & 1 \\ 0 & 0 & 0 & 1 & 1 & 0 & 0 & 0 & 1 & 1 & 0 & 0 & 0 & 1 & 1 \\ 0 & 0 & 1 & 0 & 1 & 0 & 0 & 1 & 0 & 1 & 0 & 0 & 1 & 0 & 1 \\ 0 & 1 & 1 & 1 & 1 & 0 & 1 & 1 & 1 & 1 & 0 & 1 & 1 & 1 & 1 \\ 1 & 1 & 1 & 1 & 1 & 1 & 1 & 1 & 1 & 1 & 1 & 1 & 1 & 1 & 1 \end{pmatrix}, \quad (8)$$

wherein the elements $\alpha^i$ of the Galois field GF($2^4$) have been used in their vectorial representation according to FIG. 7.

The error detection and error correction are performed on the basis of the error syndrome. If a vector $r = r_0, r^1, \ldots, r_{n-1}$ is checked for errors, the error syndrome $s^T = H \cdot r^T$ is generally formed, wherein $r^T$ is the column vector of the row vector r. In the case of the considered separated H-matrix, the syndrome s consists of three components $s_1$, $s_3$ and $s_P$ with $s_1^T = H_1 \cdot r^T,$ $s_3^T = H_3 \cdot r^T,$ $s_P = P \cdot r^T = v_0 \oplus v_1 \oplus \ldots \oplus v_{n-1}.$ The use of the systematic G-matrix for coding allows, for example, an unmodified writing of the information bits or data bits to a memory and an unmodified reading of the information bits from the memory, provided that no error is present.

By way of example, it is assumed that information bits $u_0, \ldots, u_5$ which form an information word (also referred to as a data word) consist of two partial data words (also referred to as subwords)

$x = x_0, x_1, x_2 = u_0, u_1, u_2,$ and  a.

$y = y_0, y_1, y_2 = u_3, u_4, u_5$  b.

with u=x, y. If the G-matrix is used in its systematic form according to equation (5), the following applies according to the relation (6) to the checkbits $c_0, c_1, \ldots, c_8$ of the 2-bit error-correcting BCH code $c_0 = u_0 + u_3 + u_4 + u_5,$ (9)

$c_1 = u_0 + u_1 + u_3,$ (10)

$c_2 = u_1 + u_2 + u_4,$ (11)

$c_3 = u_2 + u_3 + u_5,$ (12)

$c_4 = u_0 + u_5,$ (13)

$c_5 = u_0 + u_1 + u_3 + u_4 + u_5,$ (14)

$c_6 = u_0 + u_1 + u_2 + u_3,$ (15)

$c_7 = u_1 + u_2 + u_3 + u_4,$ (16)

$c_8 = u_2 + u_3 + u_4 + u_5.$ (17)

In the present example, the data word $u_0, u_1, \ldots, u_5$ is made up of the two subwords $u_0, u_1, u_2 = x_0, x_1, x_2 = x,$ and  i.

$u_3, u_4, u_5 = y_0, y_1, y_2 = y.$  ii.

An error-detecting code $C_{det1}$ is defined with checkbits $\gamma_0, \gamma_1, \gamma_2$ for the partial data word x, and an error-detecting code $C_{det2}$ is defined with checkbits $\delta_0, \delta_1, \delta_2$ for the partial data word y. Each of the error-detecting codes preferably comprises at least two checkbits.

The following applies to the checkbits of the code $C_{det1}$:

$\gamma_0 = u_0 = x_0,$ (18)

$\gamma_1 = u_0 + u_1 = x_0 + x_1,$ (19)

$\gamma_2 = u_1 + u_2 = x_1 + x_2,$ (20)

Equations (18), (19), and (20) for the checkbits of the error-detecting code $C_{det1}$ are derived from equations (9), (10), and (11) for the checkbits of the error-correcting code $C_{cor}$ by setting the bits $u_3, u_4, u_5$ of the second partial data word to 0 and by replacing the checkbits $c_0, c_1, c_2$ with the checkbits $\gamma_0, \gamma_1, \gamma_2$.

The following applies to the checkbits of the code $C_{det2}$:

$\delta_0 = u_3 + u_4 + u_5 = y_0 + y_1 + y_2,$ (21)

$\delta_1 = u_3 = y_0,$ (22)

$\delta_2 = u_4 = y_1.$ (23)

Equations (21), (22), and (23) for the checkbits of the error-detecting code $C_{det2}$ are derived from equations (9), (10), and (11) for the checkbits of the error-correcting code $C_{cor}$ by setting the bits $u_0, u_1, u_2$ of the first partial data word to 0 and by replacing the checkbits $c_0, c_1, c_2$ with the checkbits $\delta_0, \delta_1, \delta_2$.

The checkbits $c_0, c_1, c_2$ of the error-correcting code $C_{cor}$ are uniquely defined from the checkbits $\gamma_0, \gamma_1, \gamma_2$ of the error-detecting code $C_{det1}$ and the checkbits $\delta_0, \delta_1, \delta_2$ of the error-correcting code $C_{cor}$. In the present example application, the following applies:

$c_0 = \gamma_0 + \delta_0,$ $c_1 = \gamma_1 + \delta_1,$ $c_2 = \gamma_2 + \delta_2.$ (24)

The checkbits $c_0, c_1, c_2$ of the error-correcting code $C_{cor}$ are thus separated into the checkbits $\gamma_0, \gamma_1, \gamma_2$ of the error-detecting code $C_{det1}$ and the checkbits $\delta_0, \delta_1, \delta_2$ of the error-detecting code $C_{det2}$.

The checkbits $\gamma_0, \gamma_1, \gamma_2$ of the error-detecting code $C_{det1}$ depend only on the bits of the first partial data word, and the checkbits $\delta_0, \delta_1, \delta_2$ of the error-detecting code $C_{det2}$ depend only on the bits of the second partial data word.

The checkbits $c_3, \ldots, c_8$ of the error-correcting code $C_{cor}$ are, for example, retained unchanged and are not split up. Furthermore, these checkbits are stored in the memory.

On the whole, the checkbits $c_0, c_1, \ldots c_8$ of the error-correcting code $C_{cor}$ are uniquely defined by the checkbits $\gamma_0, \gamma_1, \gamma_2$ of the error-detecting code $C_{det1}$ and the checkbits $\delta_0, \delta_1, \delta_2$ of the error-detecting code $C_{det2}$ and also the further checkbits $c_1, \ldots c_8$.

Data bits and checkbits can be stored under corresponding addresses in an addressable memory.

It is possible that a memory has memory cells which can store at least one bit per memory cell. In one particular option, an information bit or an information value is stored using a plurality of memory cells.

For example, a first partial data word $u_0, u_1, u_2$ and the associated checkbits $\gamma_0, \gamma_1, \gamma_2$ of the error-detecting code $C_{det1}$ are written to a memory under an address $a^1$. After a while, possibly errored data bits $u'_0, u'_1, u'_2$ of the partial data word and possibly errored checkbits $\gamma'_0, \gamma'_1, \gamma'_2$ are read under the address $a^1$. For the bits that are read, a check can be carried out to determine whether a codeword of the code $C_{det1}$ is present. If such a codeword is present, no error is detected; conversely, if no codeword is present, an error is detected.

It is furthermore possible to write a second partial data word $u_3, u_4, u_5$ and the associated checkbits $\delta_0, \delta_1, \delta_2$ of the error-detecting code $C_{det2}$ to the memory under an address $a^2$. After a while, possibly errored data bits $u'_3, u'_4, u'_5$ of the partial data word and possibly errored checkbits $\delta'_0, \delta'_1, \delta'_2$ are read under the address $a^2$. For the bits that are read, a check can be carried out to determine whether a codeword of the code $C_{det2}$ is present. If such a codeword is present, no error is detected; conversely, if no codeword is present, an error is detected.

In a further option, the checkbits $c_3, c_4, c_5$ can similarly be stored under the address $a^1$ and the checkbits $c_6, c_7, c_8$ under the address $a^2$.

If an error correction is required, both the first partial data word and the corresponding checkbits are to be read under the address $a^1$ and also the second partial data word and the corresponding checkbits are to be read under the address $a^2$. The checkbits $c_0$, $c_1$, $c_2$ are defined from the checkbits $\gamma_0$, $\gamma_1$, $\gamma_2$ of the error-detecting code $C_{det1}$ read under the address $a^1$ and from the checkbits $\delta_0$, $\delta_1$, $\delta_2$ of the error-detecting code $C_{det2}$ read under the address $a^2$. The checkbits $c_3$, $c_4$, $c_5$ are read, for example, under the address $a^1$ and the checkbits $c_6$, $c_7$, $c_8$ are read, for example, under the address $a^2$, so that all necessary bits for correcting an error using the code $C_{cor}$ are available following the reading of the addresses $a^1$ and $a^2$.

It is possible that the address $a^1$ and the address $a^2$ differ only in their respective least significant bit. Optionally, the two addresses $a^1$ and $a^2$ may also differ in all bits or in other predefined address bits.

It is furthermore possible to store the partial data word $u_0$, $u_1$, $u_2$, the associated checkbits $\gamma_0$, $\gamma_1$, $\gamma_2$ of the error-detecting code $C_{det1}$, the partial data word $u_3$, $u_4$, $u_5$, the associated checkbits $\delta_0$, $\delta_1$, $\delta_2$ of the error-detecting code $C_{det2}$ and the checkbits $c_3$, ..., $c_8$ under a (common) address a of a memory with a correspondingly large word width. In the case of read access to the first partial data word, only the bits of the first partial data word are to be checked under the address a (i.e. to determine whether these bits of the first partial data word and the associated checkbits are a codeword of the error-detecting code $C_{det1}$). Accordingly, in the case of read access to the second partial data word, only the bits of the second partial data word are to be checked under the address a (i.e. to determine whether these bits of the second partial data word and the associated checkbits are a codeword of the error-detecting code $C_{det2}$). In the case of an error correction using the code $C_{cor}$, the checkbits $c_0$, $c_1$, $c_2$ are then defined from the checkbits $\gamma_0$, $\gamma_1$, $\gamma_2$ of the error-detecting code $C_{det1}$ and from the checkbits $\delta_0$, $\delta_1$, $\delta_2$ of the error-detecting code $C_{det2}$. The checkbits $c_3$, ..., $c_8$ can be read directly under the address a.

If a possibly errored partial data word $u'_0$, $u'_1$, $u'_2$ of the partial data word and possibly errored checkbits $\gamma'_0$, $\gamma'_1$, $\gamma'_2$ are read under a read address $a^1$, it is possible to check, using these bits, whether the bit combination $$\gamma'_0, \gamma'_1, \gamma'_2, u'_0, u'_1, u'_2,$$

is a codeword of the error-detecting code $C_{det1}$. This is the case if the following applies:

$$\gamma'_0 + u'_0 = 0,$$

$$\gamma'_1 + u'_0 + u'_1 = 0,$$

$$\gamma'_2 + u'_1 + u'_2 = 0,$$

or if, for the error-detecting code $C_{det1}$ with the H-matrix $H_1$, an error syndrome $S_{det1}$ $$s^T_{det1} = H_1 \cdot \begin{pmatrix} \gamma'_0 \\ \gamma'_1 \\ \gamma'_2 \\ u'_0 \\ u'_1 \\ u'_2 \end{pmatrix}$$

with $$H_1 = \begin{pmatrix} 1 & 0 & 0 & 1 & 0 & 0 \\ 0 & 1 & 0 & 1 & 1 & 0 \\ 0 & 0 & 1 & 0 & 1 & 1 \end{pmatrix}$$

is equal to 0.

If the error syndrome $S_{det1} = 0$, it is assumed that no error is present in the read bits $u'_0$, $u'_1$, $u'_2$. The read bits $u'_0$, $u'_1$, $u'_2$ of the first partial data word can therefore be used without being corrected by the error-correcting code $C_{cor}$.

If only the bits of the first partial data word are required, it is not necessary to read the bits $u'_3$, $u'_4$, $u'_5$ of the second data word. In this respect, it is advantageous that a reading of only a partial data word (as opposed to the reading of the entire data word) is possible in the error-free case.

Here, it is particularly advantageous that the checkbits $\gamma_0$, $\gamma_1$, $\gamma_2$ of the error-detecting code $C_{det1}$ are not dependent on bits which are stored under a second address $a_2$.

If a possibly errored partial data word $u'_3$, $u'_4$, $u'_5$ and possibly errored checkbits $\delta'_0$, $\delta'_1$, $\delta'_2$ are read under the read address $a^2$, it is possible to check, using these bits, whether the bit combination $$\delta'_0, \delta'_1, \delta'_2, u'_3, u'_4, u'_5$$

is a codeword of the error-detecting code $C_{det2}$. This is the case if the following applies:

$$\delta'_0 + u'_3 + u'_4 + u'_5 = 0,$$

$$\delta'_1 + u'_3 = 0,$$

$$\delta'_2 + u'_4 = 0,$$

or if, for the error-detecting code $C_{det2}$ with the H-matrix $H_2$, an error syndrome $S_{det2}$ $$s^T_{det2} = H_2 \cdot \begin{pmatrix} \delta'_0 \\ \delta'_1 \\ \delta'_2 \\ u'_3 \\ u'_4 \\ u'_5 \end{pmatrix}$$

with $$H_2 = \begin{pmatrix} 1 & 0 & 0 & 1 & 1 & 1 \\ 0 & 1 & 0 & 0 & 1 & 0 \\ 0 & 0 & 1 & 0 & 0 & 1 \end{pmatrix}$$

is equal to 0.

If the error syndrome $S_{det2} = 0$, it is assumed that no error is present in the read bits $u'_3$, $u'_4$, $u'_5$. The read bits $u'_3$, $u'_4$, $u'_5$ of the second partial data word can therefore be used without being corrected by the error-correcting code $C_{cor}$.

If only the bits of the second partial data word are required, it is not necessary to read the bits $u'_0$, $u'_1$, $u'_2$ of the first partial data word. In this respect, it is advantageous that a reading of only a partial data word (as opposed to the reading of the entire data word) is possible in the error-free case.

Here, it is particularly advantageous that the checkbits $\delta_0$, $\delta_1$, $\delta_2$ of the error-detecting code $C_{det2}$ are not dependent on bits which are stored under the first address $a_1$.

If an error is detected on reading the bits of the first partial data word under the address $a^1$ or the bits of the second partial data word under the address $a^2$, the bits stored under both the address $a^1$ and the address $a^2$ can be read.

Along with the bits $\gamma'_0, \gamma'_1, \gamma'_2, u'_0, u'_1, u'_2$ and $\delta'_0, \delta'_1, \delta'_2, u'_3, u'_4, u'_5$, the additional checkbits $c'_3, c'_4, c'_5, c'_6, c'_7, c'_8$, which are stored e.g. under the addresses $a^1$ and $a^2$, are then also read.

The checkbits $c'_0, c'_1, c'_2$ are formed from the checkbits $\gamma'_0, \gamma'_1, \gamma'_2$, and $\delta'_0, \delta'_1 \delta'_2$ according to $$c'_0 = \gamma'_0 + \delta'_0,$$

$$c'_1 = \gamma'_1 + \delta'_1,$$

$$c'_2 = \gamma'_2 + \delta'_2,$$

so that, following the reading of the bits under the addresses $a^1$ and $a^2$, the necessary checkbits $c'_0, \ldots, c'_8$ of the 2-bit error-correcting BCH code $C_{cor}$ used here by way of example are available for the data bits $u'_0, \ldots, u'_5$.

1-bit errors and 2-bit errors in the bits $c'_0, \ldots, c'_8, u'_0, \ldots, u'_5$ can be corrected by means of a known error-correction method using BCH codes. Reference is made here by way of example to Lin, S., Costello, D.: "Error Control Coding", Prentice Hall, 1983, cf. e.g. pages 151 to 155, or Okano, H., Imai H.: "A Construction Method of High-Speed Decoders Using ROM's for Bose-Chaudhuri-Hocquengiem and Reed-Solomon Codes", IEEE Transactions on Computers, VOL. C-36, NO. 10, October 1987, pages 1165 to 1171.

Through the selection of at least two checkbits of the first error-detecting code or of the second error-detecting code, special errors in the data bits, e.g. all 1-bit errors, 2-bit errors and 3-bit errors can be reliably detected, or any given bit errors can be detected with high probability. The reason for this is that the probability of detection of any given error depends on the number of checkbits of an error-detecting code.

It is possible that the address $a^1$ and the address $a^2$ differ in one bit only, for example in their least significant bit (LSB); in this case, the following applies, for example, to the address bits of the addresses $a^1$ and $a^2$:

$$a^1 = a_{l-1}^1, \ldots, a_1^1, 0 \text{ and}$$

$$a^2 = a_{l-1}^1, \ldots, a_1^1, 1.$$

In one option, the bits $\gamma_0, \ldots, \gamma_2, u_0, \ldots, u_2, \delta_0, \ldots, \delta_2, u_3, \ldots, u_5, c_3, \ldots, c_8$ can also be stored under a common address and only the respectively required bits are read from the memory, e.g. the bits $\gamma_0, \ldots, \gamma_2, u_0, \ldots, u_2$ if the first partial data word is required, or the bits $\delta_0, \ldots, \delta_2, u_3, \ldots, u_5$ if the second partial data word is required. If an error is detected by one of the error-detecting codes, the bits of both partial data words, in particular, are read.

In a further option, the additional bits $c_3, \ldots, c_8$ or some of the additional bits are stored under a further address in order to minimize the word width of the memory that is to be read, as long as no error occurs.

Incorporating the address into the error detection

In an additional example, it is shown how an address can be incorporated into the error detection. By way of example, a 2-bit error-correcting BCH code is considered over the Galois field $GF(2^4)$ with 8 checkbits and 7 information bits. The following is used as the generator polynomial $G(z)$:

$$G(z) = (z^4 + z + 1) \cdot (z^4 + z^3 + z^2 + z + 1) = z^8 + z^7 + z^6 + z^4 + 1. \quad (25)$$

Here, $$(z^4 + z + 1)$$

is the modular polynomial of $GF(2^4)$ with the primitive root $$\alpha = z$$

and $$(z^4 + z^3 + z + 1)$$

is the minimal polynomial with the root $$\alpha^3 = z^3.$$

By way of example, a global parity is not used in this code.

As already described (see also: Lin, S., Costello, D.: "Error Control Coding", Prentice Hall, 1983, page 94), the generator matrix G can be defined from the generator polynomial in its systematic form as $$G = (P_{7,8}, I_7) \quad (26)$$

with $$P_{7,8} = \begin{pmatrix} 1 & 0 & 0 & 0 & 1 & 0 & 1 \\ 1 & 1 & 0 & 0 & 1 & 1 & 1 \\ 0 & 1 & 1 & 0 & 0 & 1 & 1 \\ 1 & 0 & 1 & 1 & 1 & 0 & 0 \\ 0 & 1 & 0 & 1 & 1 & 1 & 0 \\ 0 & 0 & 1 & 0 & 1 & 1 & 1 \\ 0 & 0 & 0 & 1 & 0 & 1 & 1 \end{pmatrix} \quad (27)$$

to produce the H-matrix in its systematic form $$H = (I_8, P_{8,7}^T) \quad (28)$$

as $$H_{8,15} = \begin{pmatrix} 1 & 0 & 0 & 0 & 0 & 0 & 0 & 0 & 1 & 1 & 0 & 1 & 0 & 0 & 0 \\ 0 & 1 & 0 & 0 & 0 & 0 & 0 & 0 & 0 & 1 & 1 & 0 & 1 & 0 & 0 \\ 0 & 0 & 1 & 0 & 0 & 0 & 0 & 0 & 0 & 0 & 1 & 1 & 0 & 1 & 0 \\ 0 & 0 & 0 & 1 & 0 & 0 & 0 & 0 & 0 & 0 & 0 & 1 & 1 & 0 & 1 \\ 0 & 0 & 0 & 0 & 1 & 0 & 0 & 0 & 1 & 1 & 0 & 1 & 1 & 1 & 0 \\ 0 & 0 & 0 & 0 & 0 & 1 & 0 & 0 & 0 & 1 & 1 & 0 & 1 & 1 & 1 \\ 0 & 0 & 0 & 0 & 0 & 0 & 1 & 0 & 1 & 1 & 1 & 0 & 0 & 1 & 1 \\ 0 & 0 & 0 & 0 & 0 & 0 & 0 & 1 & 1 & 0 & 1 & 0 & 0 & 0 & 1 \end{pmatrix}. \quad (29)$$

This (8,15) H-matrix $H_{8,15}$ can be shortened into an (8,12) H-matrix $H_{8,12}$ by deleting the final 3 columns:

$$H_{8,12} = \begin{pmatrix} c_0 & c_1 & c_2 & c_3 & c_4 & c_5 & c_6 & c_7 & u_0 & u_1 & u_2 & u_3 \\ 1 & 0 & 0 & 0 & 0 & 0 & 0 & 0 & 1 & 1 & 0 & 1 \\ 0 & 1 & 0 & 0 & 0 & 0 & 0 & 0 & 0 & 1 & 1 & 0 \\ 0 & 0 & 1 & 0 & 0 & 0 & 0 & 0 & 0 & 0 & 1 & 1 \\ 0 & 0 & 0 & 1 & 0 & 0 & 0 & 0 & 0 & 0 & 0 & 1 \\ 0 & 0 & 0 & 0 & 1 & 0 & 0 & 0 & 1 & 1 & 0 & 1 \\ 0 & 0 & 0 & 0 & 0 & 1 & 0 & 0 & 0 & 1 & 1 & 0 \\ 0 & 0 & 0 & 0 & 0 & 0 & 1 & 0 & 1 & 1 & 1 & 0 \\ 0 & 0 & 0 & 0 & 0 & 0 & 0 & 1 & 1 & 0 & 1 & 0 \end{pmatrix}. \quad (30)$$

By way of example, 4 data bits $u_0, u_1, u_2, u_3$ and 8 checkbits $c_0, \ldots, c_7$ of the error-correcting BCH code $C_{cor}$ are intended to be used, wherein the considered addresses are formed in this example from 3 bits $a_1, a_2, a_3$.

The 4 data bits form a data word $u=u_0, u_1, u_2, u_3$, comprising a first partial data word $x=u_0, u_1$ which is protected by an error-detecting code $C_{det1}$, and a second partial data word $y=u_2, u_3$ which is protected by an error-detecting code $C_{det2}$.

The first partial data word x is stored together with checkbits under an address $$a^x = a_0^x, a_1^x, a_2^x$$

in a memory and the second partial data word y is stored together with checkbits under an address $$a^y = a_0^y, a_1^y, a_2^y$$

in the memory.

By way of example, the following applies:

$$a_0^y, a_1^y, a_2^y = a_0^{-x}, a_1^x, a_2^x,$$

so that $a_0^x=0$ and $a_0^y=1$ apply. The addresses $a^x$ and $a^y$ differ in this example only in their respective least significant bit (LSB). Generally, other dependencies between the bits of the addresses $a^x$ and $a^y$ are obviously also possible.

The checkbits $\gamma_0, \gamma_1, \gamma_2$, of the error-detecting code $C_{det1}$ are formed depending on the data bits $u_0, u_1$ of the first partial data word x and the address $a^x$ under which the partial data word x is stored.

The checkbits $\delta_0, \delta_1, \delta_2$, of the error-detecting code $C_{det2}$ are formed depending on the data bits $u_3, u_4$ of the second partial data word y and the address $a^y$ under which the partial data word y is stored.

The checkbits $c_0, \ldots, c_7$ of the error-correcting code $C_{cor}$ are formed in this example depending on the data bits $u_0, \ldots, u_3$.

The checkbits $c_0, \ldots, c_7$ are allocated to columns 0 to 7 and the data bits $u_0, \ldots, u_3$ allocated to columns 8 to 11 of the H-matrix $H_{8,12}$ according to equation (30).

Furthermore, the checkbits $c_0, \ldots, c_7$ of the error-correcting code $C_{cor}$ are defined by the following relations:

$$c_0 = u_0 + u_1 + u_3,$$

$$c_1 = u_1 + u_2,$$

$$c_2 = u_2 + u_3,$$

$$c_3 = u_3,$$

$$c_4 = u_0 + u_1 + u_3,$$

$$c_5 = u_1 + u_2,$$

$$c_6 = u_0 + u_1 + u_2,$$

$$c_7 = u_0 + u_2.$$

These relations are derived from the rows of the H-matrix $H_{8,12}$ according to equation (30).

The checkbits $c_0, c_1, c_4, c_7$ of the error-correcting code $C_{cor}$ are split up into the checkbits $\gamma_0, \gamma_1, \gamma_2, \gamma_3$ of the error-detecting code $C_{det1}$ and into the checkbits $\delta_0, \delta_1, \delta_2, \delta_3$ of the error-detecting code $C_{det2}$.

The checkbits $\gamma_0, \gamma_1, \gamma_2, \gamma_3$ of the first error-detecting code $C_{det1}$ are defined by the bits of the first partial data word $a_0^x$, $a_1^x$, $a_2^x$ and the bits of the address $a^x$ under which the partial data word x is stored, wherein:

$$\gamma_0 = u_0 + u_1 + \Delta_0^x,$$

$$\gamma_1 = u_1 + \Delta_1^x,$$

$$\gamma_2 = u_0 + u_1 + \Delta_2^x,$$

$$\gamma_3 = u_0 + \Delta_3^x$$

with $$(\Delta_0^x, \Delta_1^x, \Delta_2^x, \Delta_3^x) = (a_0^x, a_1^x, a_2^x, a_3^x) \cdot A \quad (31)$$

and with $$A = \begin{pmatrix} 1 & 0 & 0 & 1 \\ 1 & 0 & 1 & 1 \\ 0 & 1 & 1 & 1 \end{pmatrix} \quad (32)$$

applies here, from which, for the H-matrix $H_{det1}$ of the error-detecting code $C_{det1}$, $$H_{det1} = \begin{pmatrix} 1 & 0 & 0 & 0 & 1 & 1 & 1 & 1 & 0 \\ 0 & 1 & 0 & 0 & 0 & 1 & 0 & 0 & 1 \\ 0 & 0 & 1 & 0 & 1 & 1 & 0 & 1 & 1 \\ 0 & 0 & 0 & 1 & 1 & 0 & 1 & 1 & 1 \end{pmatrix} \quad (33)$$

is obtained. Since all columns of the matrix $H_{det1}$ are different, a Hamming code is described by the matrix $H_{det1}$.

The columns of the H-matrix $H_{det1}$ correspond in their arrangement to the bits $$\gamma_0, \gamma_1, \gamma_2, \gamma_3, u_0, u_1, a_0^x, a_1^x, a_2^x.$$

The checkbits $\delta_0, \delta_1, \delta_2, \delta_3$ of the error-detecting code $C_{det2}$ are defined by the bits of the second partial data word $a_0^y$, $a_1^y$, $a_2^y$ and the bits of the address $a^y$ under which the partial data word y is stored, wherein:

$$\delta_0 = a_3 + \Delta_0^y,$$

$$\delta_1 = u_2 + \Delta_1^y,$$

$$\delta_2 = a_3 + \Delta_2^y,$$

$$\delta_3 = u_2 + \Delta_3^y,$$

with $$(\Delta_0^y, \Delta_1^y, \Delta_2^y, \Delta_3^y) = (a_0^{-y}, a_1^y, a_y^2) \cdot A \quad (34)$$

and with $$A = \begin{pmatrix} 1 & 0 & 0 & 1 \\ 1 & 0 & 1 & 1 \\ 0 & 1 & 1 & 1 \end{pmatrix} \quad (35)$$

applies here, from which, for the H-matrix $H_{det2}$ of the error-detecting code $C_{det2}$, $$H_{det2} = \begin{pmatrix} 1 & 0 & 0 & 0 & 0 & 1 & 1 & 1 & 0 \\ 0 & 1 & 0 & 0 & 1 & 0 & 0 & 0 & 1 \\ 0 & 0 & 1 & 0 & 0 & 1 & 0 & 1 & 1 \\ 0 & 0 & 0 & 1 & 1 & 0 & 1 & 1 & 1 \end{pmatrix} \quad (36)$$

is obtained. Since all columns of the matrix $H_{det2}$ are different, a Hamming code is described by $H_{det2}$.

The columns of the H-matrix $H_{det2}$ correspond in their arrangement to the bits $$\delta_0, \delta_1, \delta_2, \delta_3, u_2, u_3, a_0^y, a_1^y, a_2^y.$$

Here, it has been assumed by way of example that the first partial data word x is stored under the address $a^x = a_0, a_1, a_2$, and the second partial data word y is stored under the address $a^y = \bar{a}_0, a_1, a_2$.

The bits $\gamma_0, \gamma_1, \gamma_2, \gamma_3, u_0, u_1, a_0, a_1, a_2$ form a codeword of the error-detecting code $C_{det1}$ in the error-free case.

If possibly errored bits $\gamma'_0, \gamma'_1, \gamma'_2, \gamma'_3, u'_0, u'_1, c'_2, c'_3$ are read under the possibly errored read address $a'_0, a'_1, a'_2$, a check can be performed with a conventional error-detecting circuit to determine whether the bits $\gamma'_0, \gamma'_1, \gamma'_2, \gamma'_3, u'_0, u'_1, a'_0, a'_1, a'_2$ represent a codeword of the error-detecting code $C_{det1}$.

If no error is detected, the read bits $u_0, u_1$ of the first partial data word are assumed to be correct and these bits are not corrected.

If, for example, the address present at the memory cells $a_0, a_1, a_2$ during writing does not match the address $a'_0, a'_1, a'_2$ during reading, the error is detected if the error can be detected in the address bits by the code $C_{det1}$. In the present example, all 1-bit address errors are detected.

If possibly errored bits $\delta'_0, \delta'_1, \delta'_2, \delta'_3, u'_2, u'_3, c'_5, c'_6$ are read under the possibly errored read address $a'_0, a'_1, a'_2$, a check can be performed with a conventional error-detecting circuit to determine whether the bits $\delta'_0, \delta'_1, \delta'_2, \delta'_3, u'_2, u'_3, \bar{a}'_0, a'_1, a'_2$ represent a codeword of the error-detecting code $C_{det1}$.

If no error is detected, the read bits $u_2, u_3$ of the second partial data word are assumed to be correct and these bits are not corrected.

Example: correction of an error in the data bits and detection of an address bit error.

It is explained below how an error can be corrected at least in the data bits, and how it can be detected that an error is present in the address bits.

By way of example, the case is considered where, during reading of the first partial data word with checkbits $c'_2, c'_3$ $$\gamma'_0, \gamma'_1, \gamma'_2, \gamma'_3, u'_0, u'_1, c'_2, c'_3$$

under the address $$a^x = a_0^x, a_1^x, a_2^x = a_0, a_1, a_2$$

an error has occurred in the bits $$\gamma'_0, \gamma'_1, \gamma'_2, \gamma'_3, u'_0, u'_1, a_0, a_1, a_2.$$

The error has been detected by means of the error-detecting code $C_{det1}$.

As a consequence of the detected error, the second partial data word $$\delta'_0, \delta'_1, \delta'_2, \delta'_3, u'_2, u'_3, c'_5, c'_6$$

is read with checkbits $c'_5, c'_6$ under the address $$a^y = a_0^y, a_1^y, a_2^y = \bar{a}_0, a_1, a_2$$

The bit sequence $$c'_0, c'_1, c'_2, c'_3, c'_4, c'_5, c'_6, c'_7, u'_0, u'_1, u'_2, u'_3$$

is defined with $$c'_0 = \gamma'_0 + \delta'_0,$$

$$c'_1 = \gamma'_1 + \delta'_1,$$

$$c'_4 = \gamma'_2 + \delta'_2,$$

$$c'_7 = \gamma'_3 + \delta'_3.$$

The checkbits $c'_0, c'_1, c'_4, c'_7$ of the error-correcting code $C_{cor}$ are thus defined from the checkbits $\gamma'_0, \ldots, \gamma'_3$ of the error-detecting code $C_{det1}$ and the checkbits $\delta'_0, \ldots, \delta'_3$ of the error-detecting code $C_{det2}$, while the remaining checkbits $c'_2, c'_3, c'_5, c'_6$ of the error-correcting code $C_{cor}$ are read from the memory as the bits of the first and second partial data word.

The checkbits $c'_0, \ldots, c'_7$ of the corresponding data word which are required for error correction of the data bits with an error-correcting code $C_{cor}$ are uniquely defined from the checkbits $\gamma'_0, \gamma'_1, \gamma'_2, \gamma'_3$ and the checkbits $\delta'_0, \delta'_1, \delta'_2, \delta'_3$ for error detection in the two partial data words and from the additional checkbits $c'_2, c'_3, c'_5, c'_6$.

The influence of the address bits on the checkbit is compensated by the selection of the addresses under which the first partial data word and the second partial data word are stored.

If the checkbits $c'_0, \ldots, c'_7$ are defined, the error correction of the data bits, for example, can be performed with the error-correcting code $C_{cor}$. In the example embodiment described, these are the data bits $u'_0, \ldots, u'_3$. An error correction of the checkbits $c'_0, \ldots, c'_7$ using the error-correcting code $C_{cor}$ is similarly possible, as is conventional in the case of error correction with error-correcting codes. Reference is made here, for example, to [Okano, H., Imai H.: "A Construction Method of High-Speed Decoders Using ROM's for Bose-Chaudhuri-Hocquengiem and Reed-Solomon Codes", IEEE Transactions on Computers, VOL. C-36, NO. 10, October 1987, pages 1165 to 1171].

In one option, the checkbits $c_0, c_1, c_4, c_7$ of the error-correcting code $C_{cor}$ are not stored in the memory, since they are definable from the checkbits $\gamma_0, \gamma_1, \gamma_2, \gamma_3$ of the error-detecting code $C_{det1}$ and the checkbits $\delta_0, \delta_1, \delta_2, \delta_3$ of the error-detecting code $C_{det2}$. In one option, these checkbits can be stored accordingly.

Use of bits derived from address bits

A further example describes the use of bits derived from address bits.

The 2-bit error-correcting (15,7) code $C_{cor}$r that is used with the H-matrix $H_{8,15}$ in systematic form $$H_{8,15} = \begin{pmatrix} c_0 & c_1 & c_2 & c_3 & c_4 & c_5 & c_6 & c_7 & u_0 & u_1 & u_2 & u_3 & a_0 & a_1 & a_2 \\ 1 & 0 & 0 & 0 & 0 & 0 & 0 & 0 & 1 & 1 & 0 & 1 & 0 & 0 & 0 \\ 0 & 1 & 0 & 0 & 0 & 0 & 0 & 0 & 0 & 1 & 1 & 0 & 1 & 0 & 0 \\ 0 & 0 & 1 & 0 & 0 & 0 & 0 & 0 & 0 & 0 & 1 & 1 & 0 & 1 & 0 \\ 0 & 0 & 0 & 1 & 0 & 0 & 0 & 0 & 0 & 0 & 0 & 1 & 1 & 0 & 1 \\ 0 & 0 & 0 & 0 & 1 & 0 & 0 & 0 & 1 & 1 & 0 & 1 & 1 & 1 & 0 \\ 0 & 0 & 0 & 0 & 0 & 1 & 0 & 0 & 0 & 1 & 1 & 0 & 1 & 1 & 1 \\ 0 & 0 & 0 & 0 & 0 & 0 & 1 & 0 & 1 & 1 & 1 & 0 & 0 & 1 & 1 \\ 0 & 0 & 0 & 0 & 0 & 0 & 0 & 1 & 1 & 0 & 1 & 0 & 0 & 0 & 1 \end{pmatrix} \quad (37)$$

is an unshortened BCH code having a length of 15 with 7 information bits $u_0, u_1, u_2, u_3, a_0, a_1, a_2$ and 8 checkbits $c_0, \ldots, c_7$. The bits $u_0, u_1, u_2, u_3$ are data bits and the bits $a_0, a_1, a_2$ are address bits. The data bits form a data word $w = u_0, u_1, u_2, u_3$ which consists of the two partial data words $w^1 = x = u_0, u_1$ and $w^2 = y = u_2, u_3$.

The word $c_0, \ldots, c_7, u_0, u_1, u_2, u_3, a_0, a_1, a_2$ is a codeword of the error-correcting code $C_{cor}$, if the following applies:

$$H_{8,15} \cdot (c_0, \ldots, c_7, u_0, u_1, u_2, u_3, a_0, a_1, a_2)^T = \underbrace{(0, \ldots, 0)^T}_{8}. \quad (38)$$

The checkbits $c_0, \ldots, c_7$ of the 2-bit error-correcting BCH code $C_{cor}$ are defined here according to the H-matrix according to equation (37) as $c_0 = u_0 + u_1 + u_3$, $c_1 = u_1 + u_2 + a_0$, $c_2 = u_2 + u_3 + a_1$, $c_3 = u_3 + a_0 + a_2$, $c_4 = u_0 + u_1 + u_3 + a_0 + a_1$, $c_5 = u_1 + u_2 + a_0 + a_1 + a_2$, $c_6 = u_0 + u_1 + u_2 + a_1 + a_2$, $c_7 = u_0 + u_2 + a_2$.

It is explained below how the checkbits $\gamma_0, \gamma_1, \gamma_2, \gamma_3$ of the error-detecting code $C_{det1}$ can be defined for the first partial data word and the checkbits $\delta_0, \delta_1, \delta_2, \delta_3$ of the error-detecting code $C_{det2}$ can be defined for the second partial data word.

To do this, the $a_0^x, a_1^x, a_2^x$ address bits are transformed into $|A_0^x, A_1^x, A_2^x$ address bits according to the relation $A_0^x, A_1^x, A_2^x = (a_0^x, a_1^x, a_2^x) \cdot M^x$, (39)

Similarly, the $a_0^y, a_1^y, a_2^y$ address bits are transformed into $|A_0^y, A_1^y, A_2^y$ address bits according to $A_0^y, A_1^y, A_2^y = (a_0^{-y}, a_1^y, a_2^y) \cdot M^y$, (40)

By way of example, the matrices $M^x$ and $M^y$ are square (3×3) matrices with the property that $M^x + M^y = I_3$ applies, wherein $I_3$ is the 3-dimensional unit matrix.

This produces the following:

$A_0^x + A_0^y, A_1^x + A_1^y, A_2^x + A_2^y = (a_0^x, a_1^x, a_2^x) \cdot [M^x + M^y] = (a_0^x, a_1^x, a_2^x)$, (41)

wherein it is again assumed that $(a_0^x, a_1^x, a) = (a_0^{-y}, a_1^y, a_2^y)$ applies.

It may be advantageous to select both the matrix $M^x$ and the matrix $M^y$ as invertible matrices, since every error in the address bits is then also expressed as an error in the corresponding modified address bits.

This can be done, for example, by selecting the matrix $M^x$ as a known companion matrix of a primitive polynomial. This is described e.g. in [Rao, R., Fujiwara E.: "Error Control Coding for Computer Systems", Prentice Hall, 1983, page 222].

By way of example, a qth-degree primitive polynomial is used, for example a modular polynomial of the corresponding Galois field $GF(2^q)$. If $P(z) = z^q + r_{q-1} z^{q-1} + r_{q-2} z^{q-2} + \ldots + r_1 z^1 + 1$ is a qth-degree primitive polynomial with binary coefficients $r_{q-1}, \ldots, r_1$, the companion matrix of this polynomial is $$\begin{pmatrix} 0 & 0 & 0 & \ldots & 0 & 1 \\ 1 & 0 & 0 & \ldots & 0 & r_1 \\ 0 & 1 & 0 & \ldots & 0 & r_2 \\ 0 & 0 & 1 & \ldots & 0 & r_3 \\ \vdots & \vdots & \vdots & \ddots & \vdots & \vdots \\ 0 & 0 & 0 & \ldots & 1 & r_{q-1} \end{pmatrix}.$$

A third-degree primitive polynomial with q=3 is $z^3 + z + 1$, and the corresponding companion matrix $M^x$ is then $$M^x = \begin{pmatrix} 0 & 0 & 1 \\ 1 & 0 & 1 \\ 0 & 1 & 0 \end{pmatrix}$$

and $M^y$ is $$M^y = I_3 + M^x = \begin{pmatrix} 1 & 0 & 0 \\ 0 & 1 & 0 \\ 0 & 0 & 1 \end{pmatrix} + \begin{pmatrix} 0 & 0 & 1 \\ 1 & 0 & 1 \\ 0 & 1 & 0 \end{pmatrix} = \begin{pmatrix} 1 & 0 & 1 \\ 1 & 1 & 1 \\ 0 & 1 & 1 \end{pmatrix}.$$

Both the matrix $M^x$ and the matrix $M^y$ are invertible. This can be verified e.g. by defining the determinant of the respective matrix which is not equal to 0.

In this example, the resulting modified addresses are as follows:

$$A_0^x, A_1^x, A_2^x = (a_0^x, a_1^x, a_2^x) \cdot \begin{pmatrix} 0 & 0 & 1 \\ 1 & 0 & 1 \\ 0 & 1 & 0 \end{pmatrix} = a_1^x, a_2^x, a_0^x + a_1^x. \quad (42)$$

$$A_0^y, A_1^y, A_2^y = \quad (43)$$

$$(\overline{a}_0^y, a_1^y, a_2^y) \cdot \begin{pmatrix} 1 & 0 & 1 \\ 1 & 1 & 1 \\ 0 & 1 & 1 \end{pmatrix} = \overline{a}_0^y + a_1^y, a_1^y + a_2^y, a_0^y + a_1^y + a_2^y.$$

The checkbits $\gamma_0, \gamma_1, \gamma_2, \gamma_3$ error-detecting code $C_{det1}$ and the checkbits $\delta_0, \delta_1, \delta_2, \delta_3$ of the error-detecting code $C_{det2}$ are selected so that $c_4 = \gamma_0 + \delta_0$, $c_5 = \gamma_1 + \delta_1$, $c_6 = \gamma_2 + \delta_2$, $c_7 = \gamma_3 + \delta_3$, (44)

applies. The following furthermore applies:

$\gamma_0 = u_0 + u_1 + A_0^x + A_1^x$, $\gamma_1 = u_1 + A_0^x + A_1^x + A_2^x$, $\gamma_2 = u_0 + u_1 + A_1^x + A_2^x$, $\gamma_3 = u_0 + A_2^x$, (45)

$\delta_0 = u_3 + A_0^y + A_1^y$, $\delta_1 = u_2 + A_0^y + A_1^y + A_2^y$, $\delta_2 = u_2 + A_1^y + A_2^y,$ $\delta_3 = u_2 + A_2^y.$ (46)

This produces e.g. for $c_4$ using equations (42), (43), (44), (45) and (46):

$$c_4 = \gamma_0 + \delta_0 =$$
$$= u_0 + u_1 + u_3 + A_0^x + A_0^y + A_1^x + A_1^y =$$
$$= u_0 + u_1 + u_3 + a_1^x + \overline{a}_0^y + a_1^y + a_2^x + a_1^y + a_2^y.$$

With $a_0^x$, $a_1^x$, $a_2^x = \overline{a}_0^y$, $a_1^y$, $a_2^y$, the following is obtained:

$c_4 = u_0 + u_1 + u_3 + a_0^x + a_1^x.$

The same applies accordingly to the remaining relations in equation (14).

The bit sequence $u_0, u_1, \gamma_0, \gamma_1, \gamma_2, \gamma_3, c_0, c_1$ is stored under the address $a^x = a_0^x$, $a_1^x$, $a_2^x$, wherein the following applies:

$c_0 = u_0 + u_1 + u_3,$ $c_1 = u_1 + u_1 + a_0^x,$ $\gamma_0 = u_0 + u_1 + A_0^x + A_1^x,$ $\gamma_1 = u_1 + A_0^x + A_1^x + A_2^x,$ $\gamma_2 = u_0 + u_1 + A_1^x + A_2^x,$ $\gamma_3 = u_0 + A_2^x.$ (47)

The bit sequence $u_2, u_3, \delta_0, \delta_1, \delta_2, \delta_3, c_2, c_3$ is stored under the address $a^y = \overline{a}_0^y$, $a_1^x$, $a_2^x$, wherein the following applies:

$c_2 = u_2 + u_3 + a_1^y,$ $c_3 = u_3 + \overline{a}_0^y + a_2^y,$ $\delta_0 = u_3 + A_0^y + A_1^y,$ $\delta_1 = u_2 + A_0^y + A_1^y + A_2^y,$ $\delta_2 = u_2 + A_1^y + A_2^y,$ $\delta_3 = u_2 + A_2^y.$ (48)

The checkbits $\gamma_0$, $\gamma_1$, $\gamma_2$, $\gamma_3$ ($a_0^y$, $a_1^y$, $a_2^y$ ror-detecting code $C_{det1}$ depend only on the data bits $u_0$, $u$ of the first partial data word and the modified address bits which $A_0^x$, $A_1^x$, $A_2^x$ are uniquely defined from the address bits $a_0^x$, $a_1^x$, $a_2^x$. The checkbits $\delta_0$, $\delta_1$, $\delta_2$, $\delta_3$ of the error-detecting code $C_{det2}$ depend only on the data bits $u_2$, $u_3$ of the second partial data word and the modified address bits $A_0^y$, $A_1^y$, $A_2^y$ which are uniquely defined from the address bits $a^y = a_0^y$, $a_1^y$, $a_2^y$. It is thereby possible to check, from the bits read under the address $a^x = a_0^x$, $a_1^x$, $a_2^x$ alone, using the error-detecting code $C_{det1}$, whether the data bits of the first partial data word are error-free. It is similarly possible to check, from the bits read under the address $a^y = a_0^y$, $a_1^y$, $a_2^y$ alone, using the error-detecting code $C_{det2}$, whether the data bits of the second partial data word are error-free.

The number of checkbits of the error-detecting code $C_{det1}$ and of the error-detecting code $C_{det2}$ can be selected in such a way that a desired error overlap is achieved. The number of checkbits of the two error-detecting codes may be the same or different.

If the number of data bits of a data word is, for example, 256, a first and a second partial data word may in each case have 128 data bits. It may be advantageous to select the number of checkbits of both error-detecting codes as equal to 8 in order to achieve a correspondingly high error overlap for any given errors, including address errors.

If a 2-bit error-correcting BCH code is used as the error-correcting code, this code may have 18 checkbits. 8 of the checkbits of the error-correcting code may then be formed in each case as XOR links in each case of one checkbit of the error-detecting code $C_{det1}$ and of the error-detecting code $C_{det2}$ so that a total of 8+8+10=26 checkbits are used.

If the global parity is additionally incorporated into the error detection, a further checkbit, referred to as the parity bit, is then used.

If a 3-bit error-correcting BCH code is used as the error-correcting code, this code may have 27 checkbits. 8 of these checkbits are then formed in each case as an XOR link in each case of one checkbit of the error-detecting code $C_{det1}$ and of the error-detecting code $C_{det2}$, so that a total of 8+8+19=35 checkbits are used.

It is also possible, for example, to subdivide the data word into more than two subwords. If, for example, 256 data bits $u = u_0, \ldots, u_{255}$ are assumed, the following subdivision into four partial data words is possible:

$x = x_0, \ldots, x_{63} = u_0, \ldots, u_{63},$ $x = y_0, \ldots, y_{63} = u_{64}, \ldots, u_{127},$ $z = z_0, \ldots, z_{63} = u_{128}, \ldots, u_{191},$ $q = q_0, \ldots, q_{63} = u_{192}, \ldots, u_{255}.$ Checkbits may be supplemented, for example, as follows:
for the partial data word x: checkbits $\gamma = \gamma_0, \ldots, \gamma_{r-1}$ of an error-detecting code $C_{det1}$;
for the partial data word y: checkbits $\delta = \delta_0, \ldots, \delta_{r-1}$ of an error-detecting code $C_{det2}$;
for the partial data word z: checkbits $\varphi = \varphi_0, \ldots, \varphi_{s-1}$ of an error-detecting code $C_{det3}$;
for the partial data word q: checkbits $\mu = \mu_0, \ldots, \mu_{s-1}$ of an error-detecting code $C_{det4}$.

The bits $x, y, z, q, c_0, \ldots, c_{r-1}, c_r, \ldots, c_{r+s-1}, c_{r+s}, \ldots, c_{m-1}$ may form a code word of an error-correcting code $C_{cor}$, wherein $$c_0 = \gamma_0 + \delta_0,$$
$$\vdots$$
$$c_{r-1} = \gamma_{r-1} + \delta_{r-1},$$
$$c_r = \varphi_0 + \mu_0,$$
$$\vdots$$
$$c_{r+s-1} = \varphi_{s-1} + \mu_{s-1}$$

may apply.

It is also possible, for example, with r=s, to select the checkbits $\gamma$, $\delta$, $\varphi$, $\mu$ in such a way that $$c_0 = \gamma_0 + \delta_0 + \varphi_0 + \mu_0,$$
$$\vdots$$
$$c_{r-1} = \gamma_{r-1} + \delta_{r-1} + \varphi_{r-1} + \mu_{r-1}$$

applies.

If an error occurs in one of the read subwords and has been detected by the corresponding error-detecting code, all 4 subwords, for example, are to be read in order to correct the error with the error-correcting code $C_{cor}$.

In the example in which the data word comprises (only) two partial data words, the reading of the data from the memory, the detection of errors and the correction of errors can be performed taking account of the following steps.

Step 1: Selecting an address $a=a_0, a_1 \ldots, a_{K-1}$ under which data are read.

Step 2: If the least significant bit $LSB(a)=a_0=0$, then continuing with step 3 with $a=a^x=0, a_1 \ldots, a_{K-1}$;

if the least significant bit $LSB(a)=a_0=1$, then continuing with step 12 with $a=a^y$.

Step 3: Reading the data from the memory under the address $a^x$.

Step 4: If the read bits of the first partial data word, the corresponding checkbits of the error-detecting code $C_{det1}$ and the bits derived from $a^x$ form a code word of the code $C_{det1}$, then continuing with step 5: it should be noted here that the bits $A^x$ derived from the address bits $a^x$, together with the data bits of the first partial data word, form the information bits of the code $C_{det1}$.

If the read bits of the first partial data word, the corresponding checkbits of the error-detecting code $C_{det1}$ and the bits derived from $a^x$ do not form a code word of the code $C_{det1}$, then continuing with step 7.

Step 5: Outputting the data bits of the first partial data word.

Step 6: End.

Step 7: Reading the data under the address $a^y_{=1}, a_1 \ldots, a_{K-1}$.

Step 8: Forming an errored code word of the error-correcting code $C_{cor}$ from the following bits:

the bits of the first partial data word read under the address $a^x$, the corresponding checkbits of the error-detecting code $C_{det1}$, the further checkbits stored under the address $a^x$, the bits of the second partial data word read under the address $a^y$, the corresponding checkbits of the error-detecting code $C_{det2}$, the further checkbits stored under the address $a^y$, and the bits of the address $a^x$.

Step 9: Correcting the correctable errors at least in the bits of the first partial data word.

Step 10: Outputting the corrected bits of the first partial data word.

Step 11: Go to step 6 (End).

Step 12: Reading the data from the memory under the address $a^y$.

Step 13: If the read bits of the second partial data word, the corresponding checkbits of the error-detecting code $C_{det2}$ and the bits derived from $a^y$ form a code word of the code $C_{det2}$, then continuing with step 14;

If the read bits of the second partial data word, the corresponding checkbits of the error-detecting code $C_{det2}$ and the checkbits derived from $a^y$ do not form a code word of the code $C_{det2}$, then continuing with step 16.

Step 14: Outputting the data bits of the second partial data word.

Step 15: Go to step 6 (End).

Step 16: Reading the data under the address $a^x=0, a_1 \ldots, a_{K-1}$

Step 17: Forming an errored code word of the error-correcting code $C_{cor}$ from the following bits:

the bits of the first partial data word read under the address $a^x$, the corresponding checkbits of the error-detecting code $C_{det1}$, the further checkbits stored under the address $a^x$, the bits of the second partial data word read under the address $a^y$, the corresponding checkbits of the error-detecting code $C_{det2}$, further checkbits stored under the address $a^y$, and the bits of the address $a^x$.

Step 18: Correcting the correctable bits of the second partial data word.

Step 19: Outputting the corrected bits of the second partial data word.

Step 20: Go to step 6 (End).

Examples of Circuit Arrangements

A number of examples of circuit arrangements are shown and explained below.

FIG. 1 shows a circuit arrangement 101 for creating checkbits.

The circuit arrangement 101 can also be referred to as an encoder, coding unit or coder. The circuit arrangement 101 comprises the partial circuits 102 to 104. The partial circuit 102 uses an error-detecting code $C_{det1}$, the partial circuit 103 uses an error-detecting code $C_{det2}$ and the partial circuit 104 uses an error-correcting code $C_{cor}$.

The partial circuit 102 has an l-bit wide input and a p-bit wide output. The partial circuit 103 has a (k–l)-bit wide input and a p-bit wide output. The partial circuit 104 has an l-bit wide and a (k–l)-bit wide input and an (m–p)-bit wide output.

A bit sequence x with $$x = u_0 \ldots, u_{l-1}$$

comprising l bits is present at both the l-bit wide input of the partial circuit 102 and the l-bit wide input of the partial circuit 104.

A bit sequence y with $$y = u_1 \ldots, u_{k-1}$$

comprising k–l bits is present at both the (k–l)-bit wide input of the partial circuit 103 and the (k–l)-bit wide input of the partial circuit 104.

The partial circuit 102 forms checkbits $\gamma_0, \ldots, \gamma_{p-1}$, so that a sequence of bits $$u_0 \ldots, u_{l-1}, \gamma_0, \ldots, \gamma_{p-1}$$

form a code word of the error-detecting code $C_{det1}$. The partial circuit 103 forms checkbits $\delta_0, \ldots, \delta_{p-1}$, so that a sequence of bits $$u_1 \ldots, u_{k-1}, \delta_0, \ldots, \delta_{p-1}$$

form a code word of the error-detecting code $C_{det2}$.

Checkbits of a data word $u_0 \ldots, u_{l-1}, u_1 \ldots, u_{k-1}$ of the example of the at least 2-bit error-correcting code $C_{cor}$ are $$c_0 \ldots, c_{p-1}, c_p \ldots, c_{m-1}.$$

By way of example, the checkbits $\gamma_0, \ldots, \gamma_{p-1}$ of the error-detecting code $C_{det1}$ and the checkbits $\delta_0, \ldots, \delta_{p-1}$ of the error-detecting code $C_{det2}$ are defined so that the following applies to a number of first p checkbits:

$$c_0 = \gamma_0 + \delta_0,$$
$$c_1 = \gamma_1 + \delta_1,$$
$$\vdots$$
$$c_{p-1} = \gamma_{p-1} + \delta_{p-1}.$$

The partial circuit 104 forms the remaining checkbits $c_p, \ldots, c_{m-1}$ from the data bits $u_0 \ldots, u_k$, so that, in total, $$c_0 = \gamma_0 + \delta_0,$$
$$c_1 = \gamma_1 + \delta_1,$$
$$\vdots$$
$$c_{p-1} = \gamma_{p-1} + \delta_{p-1},$$
$$c_p,$$
$$\vdots$$
$$c_{m-1}$$

are the checkbits of the data bits $u_0 \ldots, u_{l-1}, u_1 \ldots, u_{k-1}$ of the error-correcting code $C_{cor}$.

The partial circuits 102 to 104 are linear binary circuits for implementing the corresponding checkbits of the codes $C_{det1}$, $C_{det2}$ and $C_{cor}$. According to the underlying binary equations which are defined by the H-matrices of the corresponding codes, the binary circuits can be implemented e.g. by means of a synthesis tool.

For example, the checkbits of the error-detecting codes $C_{det1}$ and $C_{det2}$ are selected so that the first p checkbits $c_0, \ldots, c_{p-1}$ of the error-correcting code $C_{cor}$ are formed through component-by-component XOR linking of the checkbits $\gamma_0, \gamma_1, \ldots, \gamma_{p-1}$ and the checkbits $\delta_0, \delta_1, \ldots, \delta_{p-1}$.

It is also possible to form any given missing checkbits $c_{i_0}, \ldots, ci_{p-1}$ as component-by-component XOR linking of checkbits of error-detecting codes $C_{det1}$ and $C_{det2}$. Then, p can be selected so that 1<p≤m applies. A greater value of p results in a higher probability of detection of errors in the partial data words. However, since a total of m+p+k bits are to be stored, a greater value for p also results in an increased requirement in terms of the word width of the memory that is used.

Figure 2:
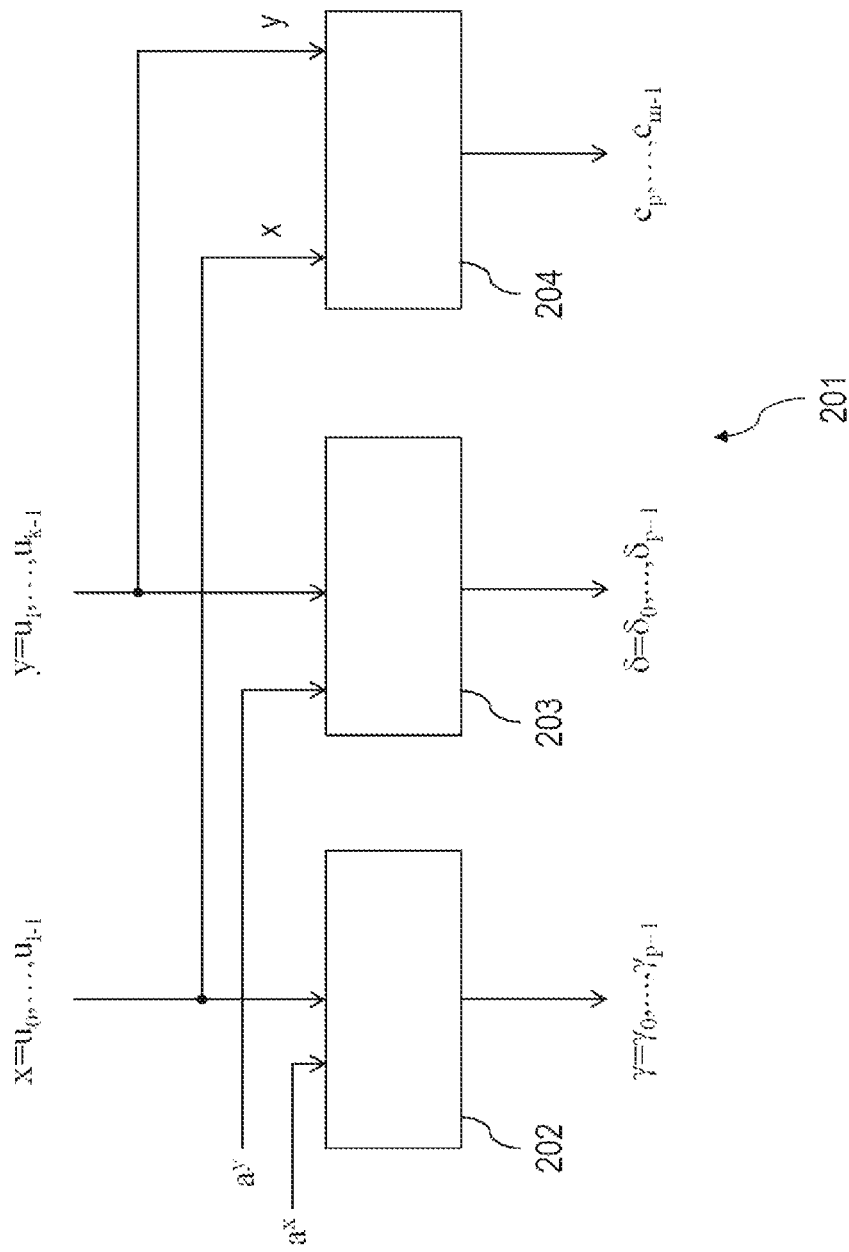
FIG. 2 shows an example embodiment of a circuit arrangement for forming checkbits.

FIG. 2 shows a circuit arrangement 201 for creating checkbits. The circuit arrangement 201 comprises the partial circuits 202 to 204. The partial circuit 202 uses an error-detecting code $C_{det1}$, the partial circuit 203 uses an error-detecting code $C_{det2}$ and the partial circuit 204 uses an error-correcting code $C_{cor}$. The circuit arrangement 201 differs from the circuit arrangement 101 according to FIG. 1 in that, in FIG. 2, address bits are incorporated into the definition of the checkbits.

The partial circuit 202 has an l-bit wide input and a p-bit wide output. Furthermore, the partial circuit 202 has an input having the word width K for, $a^x = a_0^x, \ldots, a_{k-1}^x$ of K address bits.

The partial circuit 203 has a (k-l)-bit wide input and a p-bit wide output. Furthermore, the partial circuit 203 has an input having the word width K for taking account of $ia^y = a_0^y, \ldots, a_{K-1}^y$.

The partial circuit 204 has an l-bit wide and a (k-l)-bit wide input and an (m-p)-bit wide output.

The partial circuit 202 forms the checkbits $\gamma_0, \ldots, \gamma_{p-1}$ depending $(a^x = a_0^x, \ldots, a_{K-1}^x$ of the partial data word $x = u_0, \ldots, u_{l-1}$ and the bits $u_0, \ldots, u_{l-1}$, so that the sequence of bits $$\gamma_0, \ldots, \gamma_{p-1}, u_0, \ldots, u_{l-1}, a_0^x, \ldots, a_{K-1}^x$$

form a codeword of the error-detecting code $C_{det1}$. Here, K>1 is the word width of the address $a^x$.

The partial circuit 203 forms the checkbits $\delta_0, \ldots, \delta_{p-1}$ depending $a^y = a_0^y, \ldots, a_{K-1}^y$ of the partial data word $y = u_l, \ldots, u_k$ and the bits $u_l, \ldots, u_k$, so that the sequence of bits $$\delta_0, \ldots, \delta_{p-1}, u_l, \ldots, u_k, a_0^y, \ldots, a_{K-1}^y$$

form a codeword of the error-detecting code $C_{det2}$.

The partial circuit 204 forms the checkbits $c_p, \ldots, c_{m-1}$ depending on the bits $u_0, \ldots, u_{l-1}$ of the partial data word x and the bits $u_l, \ldots, u_{k-1}$ of the partial data word y, so that the sequence of bits $$\gamma_0 + \delta_0, \ldots, \gamma_{p-1} + \delta_{p-1}, c_p, \ldots, c_m u_0, \ldots, u_{l-1}, u_l, \ldots, u_{k-1}$$

is a codeword of the error-correcting code $C_{cor}$.

In this example, the checkbits $c_p, \ldots, c_{m-1}$ of the error-correcting code $C_{cor}$ do not depend on the corresponding address bits. Similarly, the checkbits $c_0, \ldots, c_{p-1}$ of the error-correcting code $C_{cor}$ do not depend on address bits. As described, these checkbits are defined by the component-by-component (modulo 2) addition of the checkbits $$\gamma_0 + \delta_0 = c_0,$$
$$\vdots$$
$$\gamma_{p-1} + \delta_{p-1} = c_{p-1}.$$

The dependence of the checkbits $\gamma_0, \ldots, \gamma_{p-1}$ and the checkbits $\delta_0, \ldots, \delta_{p-1}$ on the address bits $a^x$ and $a^y$ is cancelled out by this component-by-component addition.

Here, the case is considered, by way example, where the address bits $a^x$ and $a^y$ differ from one another in a fixed bit position, e.g. in their least significant bit, so that the following applies:

$$a^x = a_0^x, a_1^x, \ldots, a_{K-1}^x$$
$$a^y = a_0^y, a_1^y, \ldots, a_{K-1}^y = \overline{a}_0^x, a_1^x, \ldots, a_{K-1}^x.$$

The partial circuits 202 to 204 may be implemented e.g. on the basis of XOR circuits.

Figure 3:
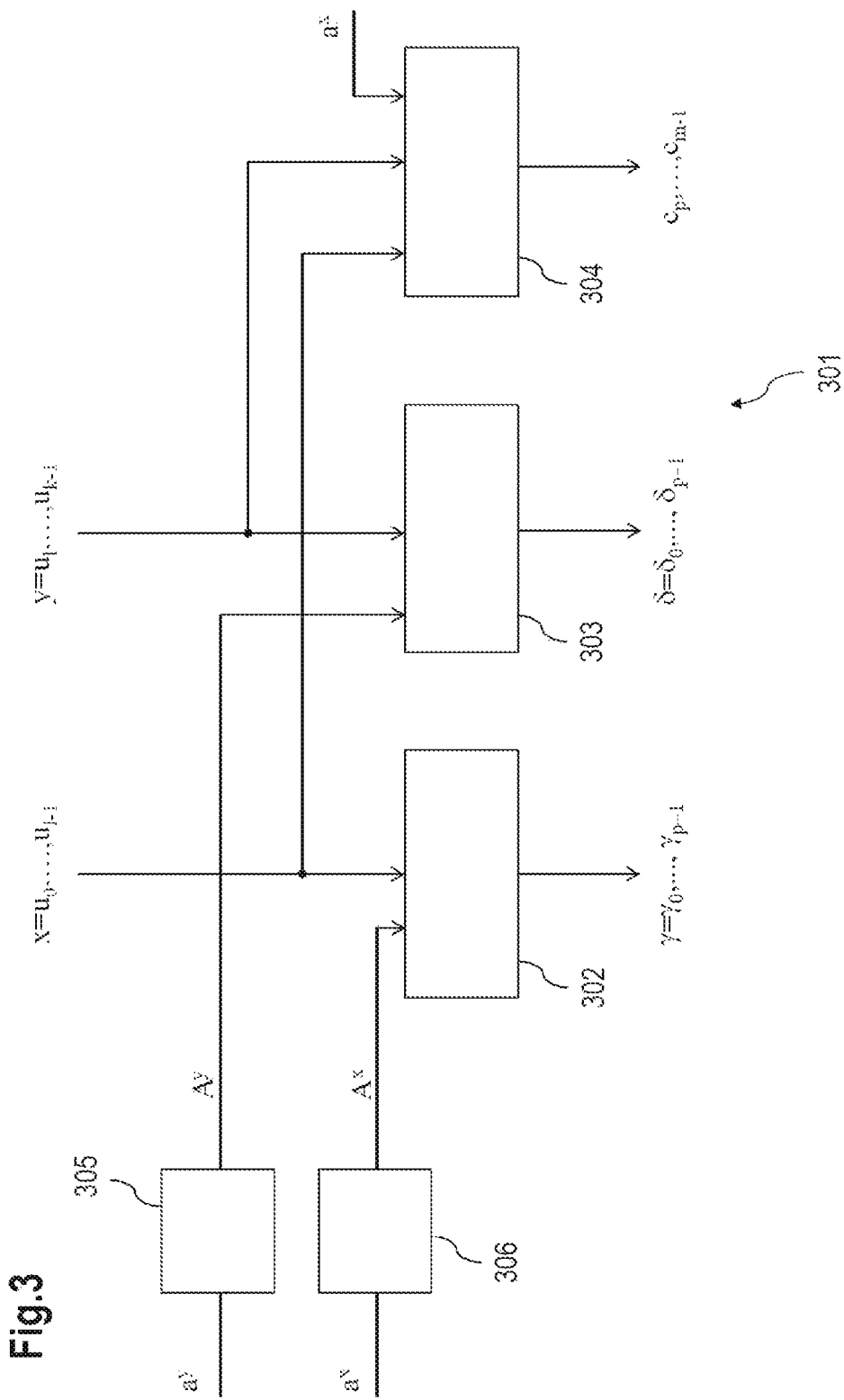
FIG. 3 shows a further example embodiment of a circuit arrangement for forming checkbits.

FIG. 3 shows a circuit arrangement 301 for creating checkbits.

The circuit arrangement 301 comprises the partial circuit 302 to 304. The partial circuit 302 uses an error-detecting code $C_{det1}$, the partial circuit 303 uses an error-detecting code $C_{det2}$ and the partial circuit 304 uses an error correcting code $C_{cor}$. Furthermore, a partial circuit 305 for creating derived address bits $A^y$ on the basis of address bits $a_1$ and a partial circuit 306 for creating derived address bits $A^x$ on the basis of address bits $a^x$ are shown.

The address bits a are transformed by the partial circuit 305 into modified address bits $A^y$ according to the relation $A^y = a^y \cdot M^y$. These modified address bits $A^y$ are fed to the partial circuit 303 which forms the checkbits $\delta_0, \ldots, \delta_{p-1}$ from them, together with the second partial data word $y = u_l, \ldots, u_{k-1}$.

The address bits $a^x$ are transformed by the partial circuit 306 into modified address bits $A^x$ according to the relation $A^x = a^x \cdot M^x$. These modified address bits $A^x$ are fed to the partial circuit 302 which forms the checkbits $\gamma_0, \ldots, \gamma_{p-1}$ from them, together with the first partial data word $x = u_0, \ldots, u_{l-1}$.

The partial circuit 302 forms the checkbits $\gamma = \gamma_0, \ldots, \gamma_{p-1}$ so that the sequence of bits $$\gamma_0, \ldots, \gamma_{p-1}, u_0, \ldots, u_{l-1}, A_0^x, \ldots, A_{K-1}^x$$

is a codeword of the error-detecting code $C_{det1}$. Here, K>1 is the word width of the address $a^x$.

The partial circuit 303 forms the checkbits $\delta = \delta_0, \ldots, \delta_{p-1}$ so that the sequence of bits $$\delta_0, \ldots, \delta_{p-1}, u_l, \ldots, u_{k-1}, A_0^y, \ldots, A_{K-1}^y$$

is a codeword of the error-detecting code $C_{det2}$.

The partial circuit 304 forms the checkbits $c_p, \ldots, c_{m-1}$ depending on
the bits $u_0, \ldots, u_{l-1}$ of the partial data word x,
the bits $u_l, \ldots, u_{k-1}$ of the partial data word y, and
address bits $a^x$,
so that the bit sequence $$\gamma_0 + \delta_0, \ldots, \gamma_{p-1} + \delta_{p-1}, c_p, \ldots, c_{m-1}, u_0, \ldots, u_{k-1}, a_0^x, \ldots, a_{K-1}^x$$

is a codeword of the error-correcting code $C_{cor}$.

For the code $C_{det1}$, the following applies to the checkbits $\gamma = \gamma_0, \ldots, \gamma_{p-1}$:

$$\gamma = x \cdot P^x + A^x \cdot A = x \cdot P^x + a^x \cdot M^x \cdot A.$$

Here, $P^x$ is an (l, p)-matrix which is a submatrix of the parity matrix $P^1$ of the code $C_{det1}$. The (K, p)-matrix A, which defines the dependency of the checkbits $\gamma = \gamma_0, \ldots, \gamma_{p-1}$ on the bits $A_0^x, \ldots, A_{K-1}^x$ derived from the address bits, is similarly a submatrix of the parity matrix $P^1$. The generator matrix $G^1$ of the code $C_{det1}$ is $$G^1 = (P^1, I_{l+K}),$$

wherein $I_{l+K}$ is the (l+K)-dimensional unit matrix and the following applies to $P^1$:

$$P^1 = \begin{pmatrix} P^x \\ A \end{pmatrix}.$$

A codeword of the code $C_{det1}$ is defined as $$[x, A^x] \cdot G^1 = [x, A^x] \cdot (P^1, I_{l+K}) = \gamma_0, \ldots, \gamma_{p-1}, x_0, \ldots, x_{l-1}, A_0^x, \ldots, A_{K-1}^x.$$

For the code $C_{det2}$, the following applies to the checkbits $\delta = \delta_0, \ldots, \delta_{p-1}$:

$$\delta = y \cdot P^y + A^y \cdot A = y \cdot P^y + a^y \cdot M^y \cdot A.$$

Here, the case is considered where $a^y$ differs from $a^x$ only in the least significant bit: $A_0^y, \ldots, A_{K-1}^y$·e the bits derived from the address bits $$a^y = a_0^y, \ldots, a_{K-1}^y = \overline{a}_0^x, a_1^x, \ldots, a_{K-1}^x$$

are defined by the relation $$A_0^y, \ldots, A_{K-1}^y = [\overline{a}_0^y, a_1^y, \ldots, a_{K-1}^y] \cdot M^y = [a_0^y, a_1^y, \ldots, a_{K-1}^x] \cdot M^y = a^x \cdot M^y.$$

The matrix $P^y$ is an (l, p)-matrix which is a submatrix of the parity matrix $P^2$ of the code $C_{det2}$. The (K, p)-matrix A, which defines the dependency of the checkbits $\gamma_0, \ldots, \gamma_{p-1}$ on the bits $A_0^y, \ldots, A_{K-1}^y$ derived from the address bits, is similarly a submatrix of the parity matrix $P^2$. The generator matrix $G^2$ of the code $C_{det2}$ is $$G^2 = (P^2, I_{l+K}),$$

wherein $I_{l+K}$ is the (l+K)-dimensional unit matrix and the following applies to $P^2$:

$$P^2 = \begin{pmatrix} P^y \\ A \end{pmatrix}.$$

A codeword of the code $C_{det2}$ is defined as $$[y, A^y] \cdot G^2 = [y, A^y] \cdot (P^2 \cdot I_{l+K}) = \delta_0, \ldots, \delta_{p-1}, y_0, \ldots, y_{l-1}, A_0^y, \ldots, A_{K-1}^y.$$

The matrices $P^1$ and $P^2$ have the same matrix A which defines the dependency of the checkbits on the derived address bits $A^x$ and $A^y$.

A codeword of the code $C_{cor}$ has the checkbits $c_0, \ldots, c_{p-1}, c_p, \ldots, c_{m-1}$. The following applies to the checkbits $c_0, \ldots, c_{p-1}$ of the code $C_{cor}$:

$$c_0, \ldots, c_{p-1} = (\gamma_0, \ldots, \gamma_{p-1}) + (\delta_0, \ldots, \delta_{p-1}) =$$
$$= x \cdot P^x + y \cdot P^y + a^x (M^x + M^y) \cdot A =$$
$$= x \cdot P^x + y \cdot P^y + a^x \cdot A,$$

since $M^x + M^y = I_K$ applies, so that the checkbits $c_0, \ldots, c_{p-1}$ depend on the bits x and y of the data word and on the address bit $a^x = a_0^x, \ldots, a_{K-1}^x$ This is advantageous, since their correctness can also be checked during the error correction, for example, of the data bits of the data word using the code $C_{cor}$. Here, $I_K$ is the K-dimensional unit matrix.

The checkbits $\delta_0, \ldots, \delta_{p-1}$ of the code $C_{det2}$ depend on the bits $A_0^y, \ldots, A_{K-1}^y$ derived from the address bits, whereas the checkbits $\gamma_0, \ldots, \gamma_{p-1}$ of the code $C_{det1}$ depend on the bits $A_0^x, \ldots, A_{K-1}^x$ derived from the address bits.

The remaining checkbits $c_p, \ldots, c_{m-1}$ of the code $C_{cor}$ depend on the data bits x and y of the data word and on the address bits $a^x$ in the form $$c_p, \ldots, c_{m-1} = (x, y, a^x) \cdot P^{Rest},$$

wherein $P^{Rest}$ is a (2·l=K, m−p)-matrix. $P^{Rest}$ is a submatrix of the parity matrix P of the code $C_{cor}$.

The parity matrix of the code $C_{cor}$ can be represented in the form $$P = \begin{pmatrix} P^x & P^{1,Rest} \\ P^y & P^{2,Rest} \\ A & A^* \end{pmatrix} \text{ with } P^{Rest} = \begin{pmatrix} P^{1,Rest} \\ P^{2,Rest} \end{pmatrix}.$$

The matrices $P^x$ and $P^y$ can be defined from the parity matrix P of the code $C_{cor}$, wherein P is a (2·l=K, m)-matrix.

The (l, p)-matrix $P^x$ can be defined from the matrix P by deleting all rows except the first to l-th row and all columns except for the first to p-th column of the matrix P.

The (l, p)-matrix $P^y$ can be defined from the matrix P by deleting all rows except the l+1-th to 2·l-th row and all columns except for the first to p-th column of the matrix P.

The matrix $P^{Rest}$ can be defined from the matrix P by deleting the first p columns and the last K rows of the matrix P.

The matrix A can be defined from the matrix P by deleting the first 2·l rows and the last m−p columns of the matrix P.

The matrix A* can be defined from the matrix P by deleting the first 2·l rows and the first p columns of the matrix P.

In order to simplify the description, it has been assumed here by way of example that the first p checkbits $c_0, \ldots, c_{p-1}$ of the code $C_{cor}$ are split up into the checkbits $\gamma_0, \ldots, \gamma_{p-1}$ of the code $C_{det1}$ and the checkbits $\delta_0, \ldots, \delta_{p-1}$ of the code $C_{det2}$. If other checkbits of the code $C_{cor}$ are split up, the columns of the parity matrix P can be permutated so that the first checkbits are split up following the permutation. It may be advantageous to select the checkbits that have been split up in such a way that the hardware requirement for the implementation of the corresponding encoders or decoders is minimized.

In the example, the checkbits $c_p, \ldots, c_{m-1}$ of the error-correcting code $C_{cor}$ depend on the corresponding unmodified address bits. In this example embodiment, the checkbits $c_0$ to $c_{p-1}$ of the error-correcting code $C_{cor}$ also depend on the unmodified address bits. As described, these checkbits are defined by the component-by-component (modulo 2) addition of the checkbits $$\gamma_0 + \delta_0 = c_0,$$
$$\vdots$$
$$\gamma_{p-1} + \delta_{p-1} = c_{p-1}.$$

The component-by-component addition of the modified address bits produces precisely the unmodified address bits $a^x$.

A number of example embodiments are presented below, which store corresponding bits in a memory.

Figure 4A:
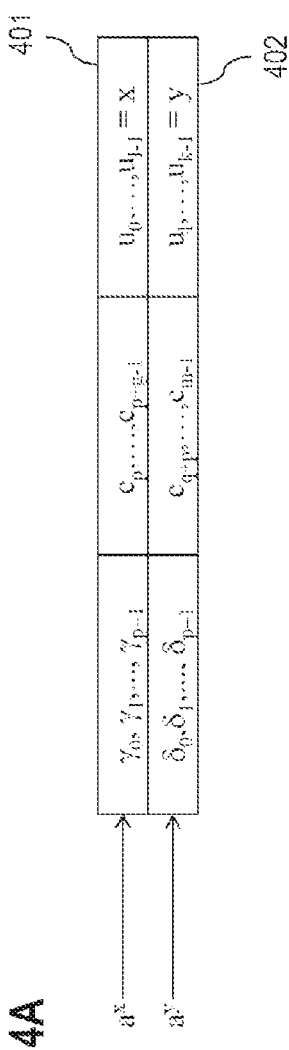
FIG. 4A shows a diagram to illustrate an occupancy of memory cells of a memory with data bits, checkbits of two error-detecting codes and an error-correcting code using two addresses.

FIG. 4A shows two addresses $a^x$ and $a^y$ of a memory. A bit sequence $$\gamma_0, \ldots, \gamma_{p-1}, c_p, \ldots, c_{p+q-1}, u_0, \ldots, u_{l-1}$$

is stored in memory cells 401 under the address $a^x$ and a bit sequence $$\delta_0, \ldots, \delta_{p-1}, c_{p+q}, \ldots, c_{m-1}, u_l, \ldots, u_{k-1}$$

is stored in memory cells 402 under the address $a^y$. It is assumed by way of example that in each case $LSB(a^x)=0$ and $LSB(a^y)=1$ apply, wherein LSB(a) denotes the least significant bit of the address a. It is also possible that the addresses $a^x$ and $a^y$ differ from one another in a different bit, for example in their most significant bit (MSB). Here, in particular, $1 < q < m$ applies.

For example, the checkbits $c_p, \ldots, C_{p+q-1}$ also depend on the bits $u_1, \ldots, u_{k-1}$ of the second partial data word y, so that the bits of the second partial data word y are preferably also known when the first partial data word $x=u_0, \ldots, u_{l-1}$ and the checkbits $\gamma_0, \ldots, \gamma_{p-1}$ are written to the memory under the address $a^x$.

For example, the bits $C_{p+q}, \ldots, c_{m-1}$ also depend on the bits $u_1, \ldots, u_{l-1}$ of the first partial data word x, so that the bits of the first partial data word x are preferably also known when the second partial data word $y=u_1, \ldots, u_{k-1}$ and the checkbits $\delta_0, \ldots, \delta_{p-1}$ are written to the memory under the address $a^y$.

Figure 4B:
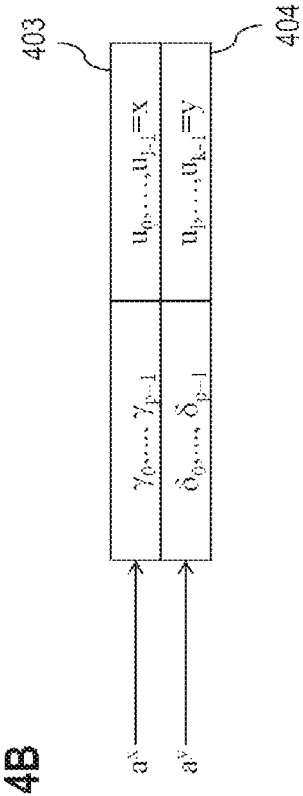
FIG. 4B shows a diagram to illustrate an occupancy of memory cells of a memory with data bits, checkbits of two error-detecting codes and an error-correcting code, wherein the checkbits of the error-correcting code are stored at an additional address.

In FIG. 4B, the checkbits $\gamma_0, \ldots, \gamma_{p-1}$ of the error-detecting code $C_{det1}$ and the data bits $u_0, \ldots, u_{l-1}$ of the first partial data word x are stored in memory cells 403 under the address $a^x$. The checkbits $\delta_0, \ldots, \delta_{p-1}$ of the error-detecting code $C_{det2}$ and the data bits $u_1, \ldots, u_{k-1}$ of the second partial data word y are stored in memory cells 404 under the address $a^y$. Further checkbits $c_p, \ldots, c_{m-1}$ of the error-correcting code $C_{cor}$ are stored in memory cells 405 under a further address $a^{z(x,y)}$.

Figure 4C:
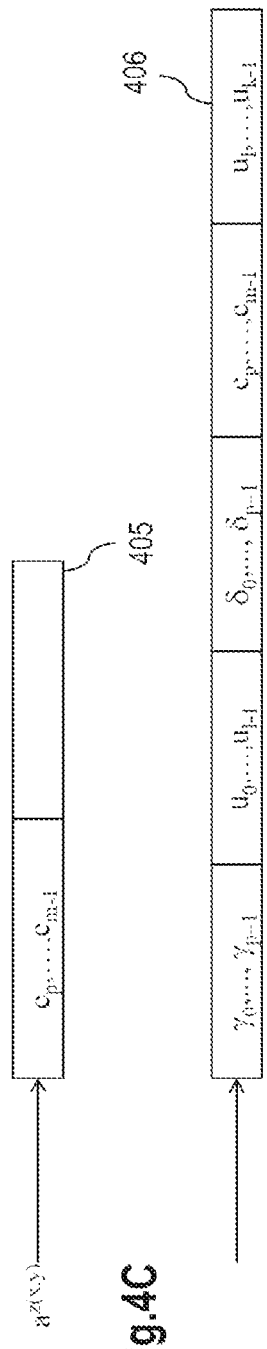
FIG. 4C shows a diagram to illustrate an occupancy of memory cells of a memory with data bits, checkbits of two error-detecting codes and an error-correcting code, under a single address.

FIG. 4C shows memory cells 406 which can be accessed via an address $a=a^x=a^y$, wherein:

the checkbits $\gamma_0, \ldots, \gamma_{p-1}$ and the data bits $u_0, \ldots, u_{l-1}$ of the first data word x, the checkbits $\delta_0, \ldots, \delta_{p-1}$ and the data bits $u_1, \ldots, u_{k-1}$ of the second data word y, and the remaining checkbits $c_p, \ldots, c_{m-1}$ are stored in these memory cells 406. When the corresponding subwords and associated checkbits are read, the required bits can be selected, for example, using a multiplexer.

FIG. 5A shows an example of an arrangement of a partial circuit for error detection during the reading of a first partial data word x' using the error-detecting code $C_{det1}$. The partial circuit comprises a syndrome generator 501 for defining an error syndrome $s_x$ for an error-detecting code $C_{det1}$, a NOR circuit 502 (NOR: NOT-OR) and an AND circuit 503. The AND circuit 503 comprises, for example, a number of l AND gates, each having two inputs and one output.

The syndrome generator 501 comprises, in particular, the following inputs:

a K-bit wide input at which the possibly errored bits $$a^{x'} = a_0^{x'}, \ldots, a_{K-1}^{x'}$$

of the read address are present, a p-bit wide input at which the possibly errored checkbits $$\gamma' = \gamma'_0, \ldots, \gamma'_{p-1}$$

are present, an l-bit wide input at which the possibly errored data bits $$a^{x'} = a_0^{x'}, \ldots, a_{K-1}^{x'}$$

of the first partial data word are present.

The errored data bits $x' = u'_0, \ldots, u'_{l-1}$ of the first partial data word are also fed to the l first inputs of the AND circuit 503.

Here, K is the word width of the read address $a^x$. The syndrome generator 501 forms an error syndrome $s_x$ according to the H-matrix of the error-detecting code $C_{det1}$ and makes it available at its output. The output of the syndrome generator 501 is connected to the input of the NOR circuit 502 which outputs the value $E_x=1$ if $s_x=0, \ldots, 0$ applies, and
outputs the value $E_x=0$ if $s_x \neq 0, \ldots, 0$ applies.

The 1-bit wide output of the NOR circuit 502 is connected in each case to a first input of the l AND gates of the AND circuit 503, wherein the lines carrying the data bits $x'=u'_0, \ldots, u'_{l-1}$ are connected in each case to the second input of a corresponding AND gate of the AND circuit 503 which outputs the correct values $x=u_0, \ldots, u_{l-1}$ at its l-bit wide output if no error has been detected in the possibly errored bits $x'=u'_0, \ldots, u'_{l-1}$ and $E_x=1$ applies. The AND circuit 503 outputs $$\underbrace{0, \ldots, 0}_{l}$$

if an error has been detected by the partial circuit for error detection shown in FIG. 5A. This l-fold output of the value 0, i.e. a value 0 at each bit position of the l bits, is also abbreviated to $\{0\}_l$.

Figure 5B:
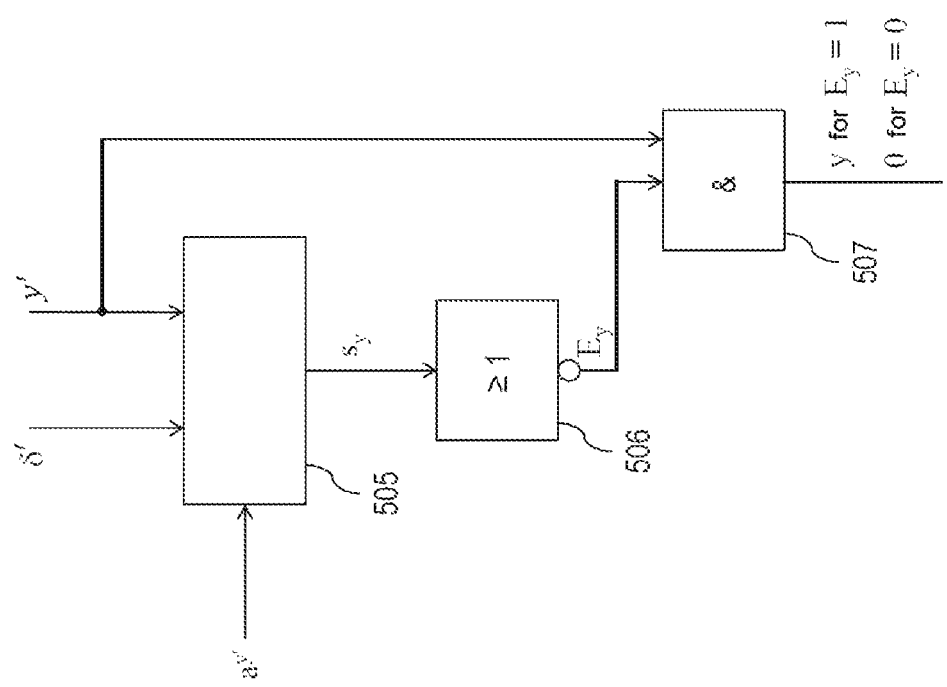
FIG. 5B shows a circuit arrangement for error detection in a second partial data word using a second error-detecting code.

FIG. 5B shows an example of a partial circuit for error detection during the reading of a second partial data word y' using the error-detecting code $C_{det2}$. The partial circuit comprises a syndrome generator 505 for defining an error syndrome $s_y$ for an error-detecting code $C_{det2}$, a NOR circuit 506 and an AND circuit 507. The AND circuit 507 comprises, by way of example, a number of (k–l) AND gates, each having two inputs and one output.

The syndrome generator 505 comprises, in particular, the following inputs:
a K-bit wide input at which the possibly errored bits $$a^{y'} = a_0^{y'}, \ldots, a_{K-1}^{y'}$$

of the read address are present,
a p-bit wide input at which the possibly errored checkbits $$\delta' = \delta'_0, \ldots, \delta'_{p-1}$$

are present,
a k-bit wide input at which the possibly errored data bits $$y' = u'_l, \ldots, u'_{k-1}$$

of the second partial data word are present.

The possibly errored data bits $y'=u'_l, \ldots, u'_{k-1}$ of the second partial data word also fed to the (k–l) first inputs of the AND circuit 507.

The syndrome generator 505 forms an error syndrome $s_y$ according to the H-matrix of the error-detecting code $C_{det2}$ and makes it available at its output. The output of the syndrome generator 505 is connected to the input of the NOR circuit 506 which
outputs the value $E_y=1$ if $s_y=0, \ldots, 0$ applies, and
outputs the value $E_y=0$ if $s_y \neq 0, \ldots, 0$ applies.

The 1-bit wide output of the NOR circuit 506 is connected in each case to a first input of the k–l AND gates of the AND circuit 507, wherein the lines carrying the data bits $u', \ldots, u'_{k-1}$ are connected in each case to the second input of a corresponding AND gate of the AND circuit 507 which outputs the correct values $y=u_l, \ldots, u_{k-1}$ at its (k–l)-bit wide output if no error has been detected in the possibly errored bits $y'=u'_l, \ldots, u'_{k-1}$ and $E_y=1$ applies. The AND circuit 507 outputs $\{0\}_{k-l}$ if an error has been detected by the partial circuit shown in FIG. 5B.

The syndrome generators 501 and 505 can take account of the possibly error $a^{x'}=a_0^{x'}, \ldots, a_{K-1}^{x'} a^{y'}=a_0^{y'}, \ldots, a_{K-1}^{y'} d$, as shown by way of example in FIG. 5A and FIG. 5B. Instead of these read addresses,
the syndrome generator 501 can take account at its input of a number of L possibly errored modified bits $A^{x'}=A_0^{x'}, \ldots, A_{L-1}^{x'}$ the read address, and
the syndrome generator 505 can take account at its input of a number of L possibly errored modified bits $A^{y'}=A_0^{y'}, \ldots, A_{K-1}^{y'}$ the read address.

Figure 6:
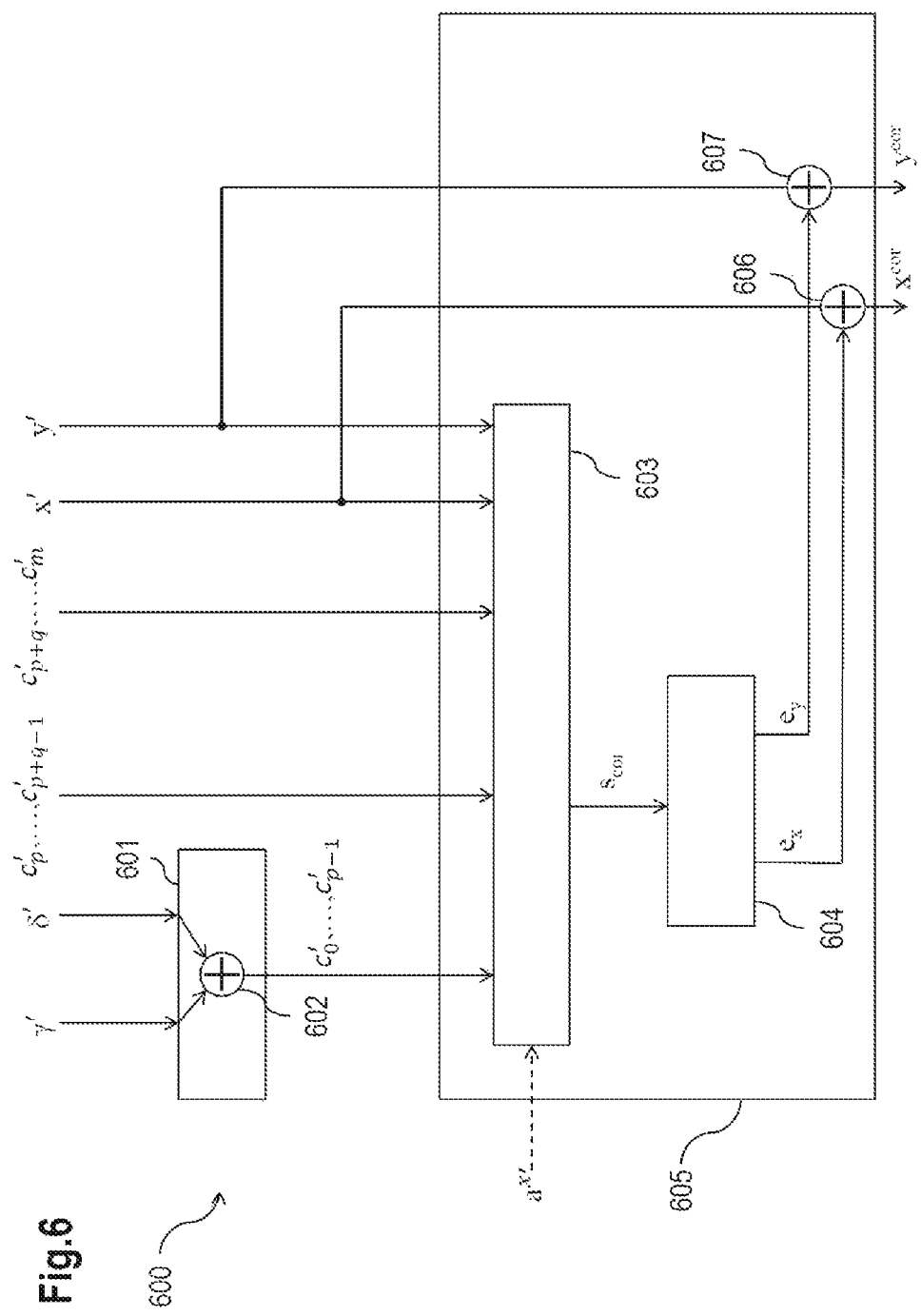
FIG. 6 shows an example of a circuit arrangement for correcting errors in data bits.

FIG. 6 shows an example of a circuit arrangement 600 for error correction comprising a checkbit combiner 601 and a correction circuit 605 comprising a syndrome generator 603, a decoder 604 and XOR circuits 606, 607.

If an error has been detected during the reading of a possibly errored first partial data word x' under the possibly errored address $a^{x'}$ or during the reading of a possibly errored second partial data word y' under a possibly errored address $a^{y'}$, the error can be corrected by the circuit arrangement 600 if it is correctable by the error-correcting code $C_{cor}$.

The checkbit combiner 601 comprises an XOR circuit 602 consisting of p XOR gates, each having two inputs and one output, by means of which a component-by-component XOR linking of the checkbits $\gamma'_0, \ldots, \gamma'_{p-1}$ with the checkbits $\delta'_0, \ldots, \delta'_{p-1}$ in the form of $$c'_0 = \gamma'_0 + \delta'_0,$$
$$\vdots$$
$$c'_{p-1} = \gamma'_{p-1} + \delta'_{p-1}$$

is carried out. For this purpose, the checkbit combiner 601 has
a p-bit wide input at which the possibly errored checkbits $\gamma'_0, \ldots, \gamma'_{p-1}$ are present which are formed according to the first error-detecting code $C_{det1}$,
a p-bit wide input at which the possibly errored checkbits $\delta'_0, \ldots, \delta'_{p-1}$ present which are formed according to the second error-detecting code $C_{det2}$,
a p-bit wide output at which the possibly errored checkbits $c'_0, \ldots, c'_{p-1}$ are made available which are checkbits of the error-correcting code $C_{cor}$.

The syndrome generator 603 has
a p-bit wide input which is connected to the output of the checkbit combiner 601,
a q-bit wide input at which the possibly errored checkbits $c'_p, \ldots, c'_{p+q-1}$ are made available,
an (m–q–p)-bit wide input at which the possibly errored checkbits $c'_{p+q}, \ldots, c'_{m-1}$ are made available,
an l-bit wide input at which the possibly errored data bits $u'_0, \ldots, u'_{l-1}$ are made available,
a (k–l)-bit wide input at which the possibly errored data bits $u'_l, \ldots, u'_{k-1}$ are made available,
an L-bit wide input at which the L possibly errored address bits are present,
an output at which an error syndrome $S_{cor}$ is made available according to the H-matrix of the error-correcting code $C_{cor}$.

The output of the syndrome generator 603 is connected to the input of the decoder 604. The decoder 604 forms a correction vector $e_x$, $e_y$ and outputs the correction vector $e_x$ at an l-bit wide output and the correction vector $e_y$ at a (k–l)-bit wide output.

The possibly errored data bits $u'_0, \ldots, u'_{l-1}$ of the first partial data word x' are present at the first input of the XOR circuit 606 and the correction vector $e_x$ is present at the second input of the XOR circuit 606. The corrected data bits $$u_0^{cor} = u'_0 + c_0,$$
$$\vdots$$
$$c_{l-1}^{cor} = u'_{l-1} + c_{l-1}$$

are made available at the l-bit wide output of the XOR circuit 606.

The possibly errored data bits $u'_1, \ldots, u'_{k-1}$ of the second partial data word y' are present at the first input of the XOR circuit 607 and the correction vector $e_y$ is present at the second input of the XOR circuit 607. The corrected bits $$u_0^{cor} = u'_1 + c_1,$$
$$\vdots$$
$$c_{k-1}^{cor} = u'_{k-1} + c_{k-1}$$

are made available at the (k–l)-bit wide output of the XOR circuit 607.

In the case where the address bits $a^x$ are not bits of a codeword of the error-correcting code $C_{cor}$, the input of the syndrome generator 603 via which the address bits are made available can be dispensed with.

In the example embodiment, the correction circuit 605 is implemented by way of example using the syndrome generator 603 and the decoder 604. It is also possible to implement the correction circuit in a different manner. For example, the decoder can be implemented as a majority decoder for special codes (e.g. for a Reed-Muller code or for a cross-parity code).

Further advantages and optional embodiments

The approach described here is suitable, for example, for any refresh memories, i.e. memories of which the content is reconstituted at predefined times.

For example, a check could be carried out during (any given) occurring read access to the memory to determine whether an error is present in one of the partial data words and therefore in the data word itself. In one possible implementation, the possibly simplistic assumption can be made that no error is present in the data word if no error has been detected in at least one partial data word. This works particularly advantageously for memories or for correspondingly designed error-resistant applications which have a relatively low error probability. In one particular option here, one of the partial data words is checked more or less regularly (e.g. at predefined times or on the basis of predefined events). As described, a check is carried out to determine whether the checkbits associated with the partial data word and the bits of the partial data word represent a codeword of an error-detecting code. If so, no bit error is present in the partial data word.

As an extension, a checking algorithm can be executed for the data word in such a way that different partial data words of the data word are checked at different times: If, according to one example, the data word comprises two partial data words, the first partial data word could be checked in a first pass and the second partial data word could be checked in a second pass. The first pass and the second pass may, for example, be (regularly or irregularly) alternated or repeated. The data word can thus be (partially) checked in principle at different times (if necessary repeatedly) by checking only one or at least one of its partial data words (if the data word comprises more than two partial data words). This partial check offers the advantage that it takes less time than would be required if the entire data word were checked for errors. In particular, for specific memory architectures, only a part of the data word (i.e. the partial data word) can be accessed more efficiently than the data word, which possibly requires a plurality of accesses to the physical memory. In one particular option, the remaining bits of the data word are accessed only if an error has been detected.

In a next step, as described above, an attempt can be made to correct the error in such a case. The error correction can advantageously be attempted only if it has previously been ascertained that the error is also correctable. Optionally, if it has been determined that the error is not correctable (by means of the available error correction), an error message or an error signal, for example, can be output, a repair can be carried out or some other predefined action can be initiated.

For example, the approach described here is suitable, in particular, for detecting and, if necessary, correcting temporary (transient) memory errors. Different contents can be defined in the case of a transient memory error for a memory cell involving different read operations. This transient memory error can be detected (for a subword) by means of the described error detection and can be corrected if necessary by means of the described error correction.

It is also possible that static errors in memories can be detected (and, if necessary, corrected) accordingly with the approach explained here.

What is claimed is:

1. A method for processing a data word that comprises a first partial data word and a second partial data word, comprising:
defining first checkbits for the first partial data word using a first partial circuit, wherein the first partial data word and the first checkbits form a first codeword of the data word,
defining second checkbits for the second partial data word using a second partial circuit, wherein the second partial data word and the second checkbits form a second codeword of the data word,
defining third checkbits for the data word using a third partial circuit, wherein at least the data word, a linking of the first checkbits with the second checkbits, and the third checkbits are parts of a third codeword of the data word.

2. The method as claimed in claim 1, in which at least two bits of the first checkbits and at least two bits of the second checkbits are linked.

3. The method as claimed in claim 1, in which the first checkbits, the second checkbits and the third checkbits are stored.

4. The method as claimed in claim 1, in which the linking of the first checkbits with the second checkbits comprises one of the following options:
an exclusive OR linking,
an exclusive NOT-OR linking, or
a combination or juxtaposition of the first checkbits and the second checkbits.

5. The method as claimed in claim 1, further comprising storing the first partial data word and the second partial data word in a memory.

6. The method as claimed in claim 1, wherein the first codeword is a codeword of a first error code and the second codeword is a codeword of a second error code.

7. The method as claimed in claim 6, wherein the first error code and the second error code are in each case an error-detecting code or an error-correcting code.

8. The method as claimed in claim 1, wherein the third codeword is a codeword of a third error code.

9. The method as claimed in claim 8, wherein the third error code is an error-correcting code.

10. The method as claimed in claim 8, wherein the third error code has a distance between codes greater than or equal to three or greater than or equal to five.

11. The method as claimed in claim 1, wherein the number of first checkbits is greater than or equal to two or the number of second checkbits is greater than or equal to two.

12. The method as claimed in claim 1, wherein the first checkbits, the second checkbits and/or the third checkbits comprise address bits or bits derived from address bits.

13. The method as claimed in claim 1, wherein the first partial data word, the first checkbits and address bits or bits derived from address bits form the first codeword.

14. The method as claimed in claim 1, wherein the second partial data word, the second checkbits and address bits or bits derived from address bits form the second codeword.

15. The method as claimed in claim 1, wherein the third codeword further comprises address bits or bits derived from address bits.

16. The method as claimed in claim 1, wherein the first checkbits, the second checkbits and/or the third checkbits are stored at different addresses of a memory.

17. The method as claimed in claim 16, wherein the first partial data word and the second partial data word are stored at addresses of the memory that differ from one another.

18. The method as claimed in claim 17, in which the different addresses differ in their lowest-value bit or in all bits.

19. The method as claimed in claim 16, in which the memory comprises a cache memory, a register or a register array, a flash memory, an MRAM, an SRAM, an RE-RAM, a PC RAM, or an FE-RAM.

20. A method for processing a data word, wherein the data word comprises a first partial data word and a second partial data word, comprising:
    defining a first bit sequence at least on the basis of first checkbits and the first partial data word using a first partial circuit,
    checking whether the first bit sequence is a codeword,
    if the first bit sequence is not a codeword:
        performing an error correction of the data word at least on the basis of the first checkbits and further checkbits,
        wherein the further checkbits are defined using the first checkbits.

21. The method as claimed in claim 20, wherein the further checkbits are defined using at least two first checkbits.

22. The method as claimed in claim 20, wherein the first checkbits are associated with the first partial data word.

23. The method as claimed in claim 20,
    wherein the further checkbits comprise second checkbits and third checkbits,
    wherein the second checkbits are associated with the second partial data word, and
    wherein the third checkbits are associated with the data word.

24. The method as claimed in claim 23, wherein the error correction of the data word is performed based on a linking of the first checkbits, the second checkbits and the third checkbits.

25. The method as claimed in claim 23, wherein the number of first checkbits is greater than or equal to two, or wherein the number of second checkbits is greater than or equal to two.

26. The method as claimed in claim 20, further comprising carrying out a predefined first action if the first bit sequence is a codeword.

27. The method as claimed in claim 20, further comprising performing a correction of the first partial data word on the basis of the first checkbits if the first bit sequence is not a codeword.

28. The method as claimed in claim 20, wherein the first checkbits, the first partial data word, the second partial data word and the further checkbits are read from a memory.

29. The method as claimed in claim 20, wherein the codeword is a codeword of an error-correcting code.

30. The method as claimed in claim 20, further comprising performing the error correction of the data word based on the first checkbits and the further checkbits, and also based on address bits or bits derived from address bits if the first bit sequence is not a codeword.

31. The method as claimed in claim 20, further comprising defining the first bit sequence based on the first checkbits, the first partial data word and address bits or bits derived from address bits.

32. A circuit arrangement for processing a data word, wherein the data word comprises a first partial data word and a second partial data word, wherein the circuit arrangement comprises:
    a first partial circuit configured to define first checkbits for the first partial data word, wherein the first partial data word and the first checkbits form a first codeword of the data word,
    a second partial circuit configured to define second checkbits for the second partial data word, wherein the second partial data word and the second checkbits form a second codeword of the data word,
    a third partial circuit configured to define third checkbits for the data word, wherein at least the data word, a linking of the first checkbits with the second checkbits, and the third checkbits are parts of a third codeword of the data word.

33. A device for processing a data word, wherein the data word comprises a first partial data word and a second partial data word, wherein the device comprises a processing unit which is configured in hardware or is configured to receive instructions from a memory that upon execution of the instructions is configured to:
    define a first bit sequence at least based on first checkbits and the first partial data word,
    check whether the first bit sequence is a codeword,
    if the first bit sequence is not a codeword:
        perform an error correction of the data word at least based on the first checkbits and further checkbits,
        wherein the further checkbits are defined using the first checkbits.

* * * * *